United States Patent
Cheon et al.

(10) Patent No.: US 9,948,268 B2
(45) Date of Patent: Apr. 17, 2018

(54) MULTIBAND ANTENNA HAVING EXTERNAL CONDUCTOR AND ELECTRONIC DEVICE INCLUDING THE SAME

(71) Applicant: SAMSUNG ELECTRO-MECHANICS CO., LTD., Suwon-si (KR)

(72) Inventors: Young Min Cheon, Suwon-si (KR); Dae Seong Jeon, Suwon-si (KR); Nam Ki Kim, Suwon-si (KR); Jun Seung Yi, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 102 days.

(21) Appl. No.: 15/010,371

(22) Filed: Jan. 29, 2016

(65) Prior Publication Data
US 2016/0233583 A1     Aug. 11, 2016

(30) Foreign Application Priority Data

Feb. 9, 2015    (KR) .................. 10-2015-0019538
Mar. 6, 2015    (KR) .................. 10-2015-0031813
(Continued)

(51) Int. Cl.
*H01Q 1/50*      (2006.01)
*H03H 7/38*      (2006.01)
(Continued)

(52) U.S. Cl.
CPC .............. *H03H 7/38* (2013.01); *H01Q 1/243* (2013.01); *H01Q 1/38* (2013.01); *H01Q 5/335* (2015.01); *H01Q 7/00* (2013.01); *H01Q 9/42* (2013.01)

(58) Field of Classification Search
CPC .................................. H01Q 5/50; H01Q 1/24
(Continued)

(56) References Cited

U.S. PATENT DOCUMENTS 8,842,048 B2    9/2014   Kim et al.
9,166,279 B2    10/2015   Jin et al.
(Continued)

FOREIGN PATENT DOCUMENTS

CN       1745500 A     3/2006
CN     101483270 A     7/2009
(Continued)

OTHER PUBLICATIONS

Korean Office Action dated Jan. 12, 2017 in corresponding Korean patent application No. 10-2016-0032594 (11 pages with English translation).
(Continued)

*Primary Examiner* — Huedung Mancuso
(74) *Attorney, Agent, or Firm* — NSIP Law

(57) ABSTRACT

A multiband antenna includes a conductive connecting member, an external conductor, and a conductor frame. The conductive connecting member is disposed on a non-metallic region of an electronic device. The external conductor is disposed on an external surface of the electronic device from a first connecting terminal connected to an end of the conductive connecting member to first and second path terminals, respectively, located opposite to each other. The conductor frame is connected to the first and second path terminals and a ground of a substrate. The external conductor includes a first external radiation conductor disposed between the first path terminal and the first connecting terminal, and a second external radiation conductor inte-
(Continued)

grally formed with the first external radiation conductor and disposed between the second path terminal and the first connecting terminal.

23 Claims, 35 Drawing Sheets

(30) Foreign Application Priority Data

| | | | |
|---|---|---|---|
| Mar. 18, 2015 | (KR) | ........................ | 10-2015-0037641 |
| Mar. 26, 2015 | (KR) | ........................ | 10-2015-0042153 |
| Jul. 24, 2015 | (KR) | ........................ | 10-2015-0104930 |

(51) Int. Cl.
  *H01Q 1/24* (2006.01)
  *H01Q 1/38* (2006.01)
  *H01Q 7/00* (2006.01)
  *H01Q 9/42* (2006.01)
  *H01Q 5/335* (2015.01)

(58) Field of Classification Search
  USPC ......................................................... 343/860
  See application file for complete search history.

(56) References Cited

U.S. PATENT DOCUMENTS

| | | | |
|---|---|---|---|
| 9,246,221 B2 | 1/2016 | Jin et al. | |
| 2004/0257283 A1* | 12/2004 | Asano | ................... H01Q 1/243 |
| | | | 343/702 |
| 2006/0114159 A1 | 6/2006 | Yoshikawa et al. | |
| 2008/0316121 A1* | 12/2008 | Hobson | ................. H01Q 1/243 |
| | | | 343/702 |
| 2012/0229347 A1* | 9/2012 | Jin | ........................ H01Q 1/243 |
| | | | 343/702 |
| 2012/0231750 A1 | 9/2012 | Jin et al. | |
| 2012/0262345 A1* | 10/2012 | Kim | ....................... H01Q 1/243 |
| | | | 343/702 |
| 2013/0057437 A1 | 3/2013 | Chiu et al. | |
| 2014/0292590 A1* | 10/2014 | Yoo | ........................ H01Q 1/243 |
| | | | 343/702 |

FOREIGN PATENT DOCUMENTS

| | | |
|---|---|---|
| CN | 102683861 A | 9/2012 |
| CN | 102684722 A | 9/2012 |
| CN | 102738556 A | 10/2012 |
| CN | 102983405 A | 3/2013 |
| CN | 103117452 A | 5/2013 |
| CN | 103548039 A | 1/2014 |
| CN | 104079313 A | 10/2014 |
| CN | 104221215 A | 12/2014 |
| CN | 104269609 A | 1/2015 |
| EP | 2784873 A1 | 10/2014 |
| KR | 10-0954379 B1 | 4/2010 |
| KR | 10-2012-0102517 A | 9/2012 |
| KR | 10-2014-0109649 A | 9/2014 |
| KR | 10-2014-0119928 A | 10/2014 |
| WO | WO 2008/051057 A1 | 5/2008 |
| WO | WO 2013/115939 A1 | 8/2013 |

OTHER PUBLICATIONS

Chinese Office Action dated Feb. 24, 2018 in counterpart Chinese Patent Application No. 201610080940.5 (46 pages, in Chinese with English translation).

* cited by examiner

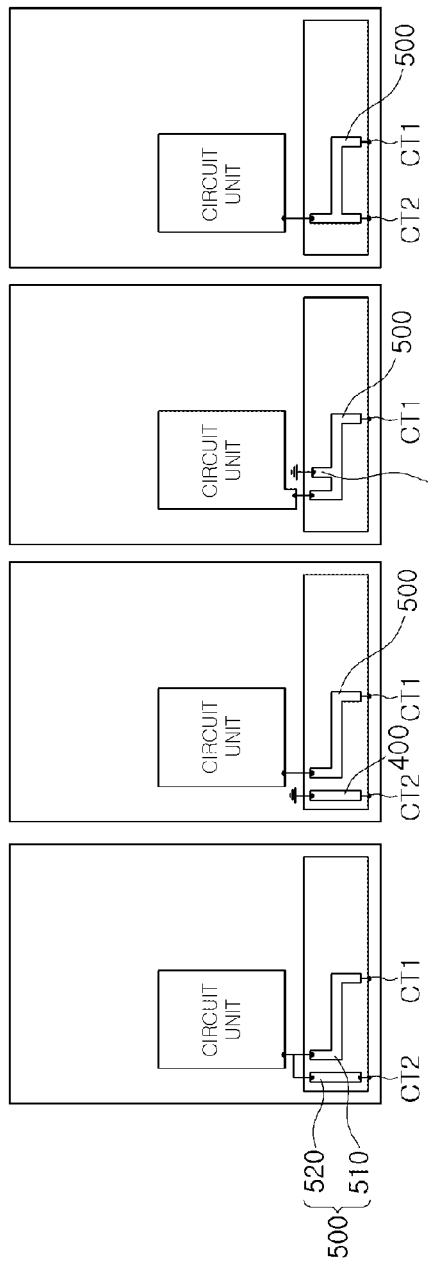

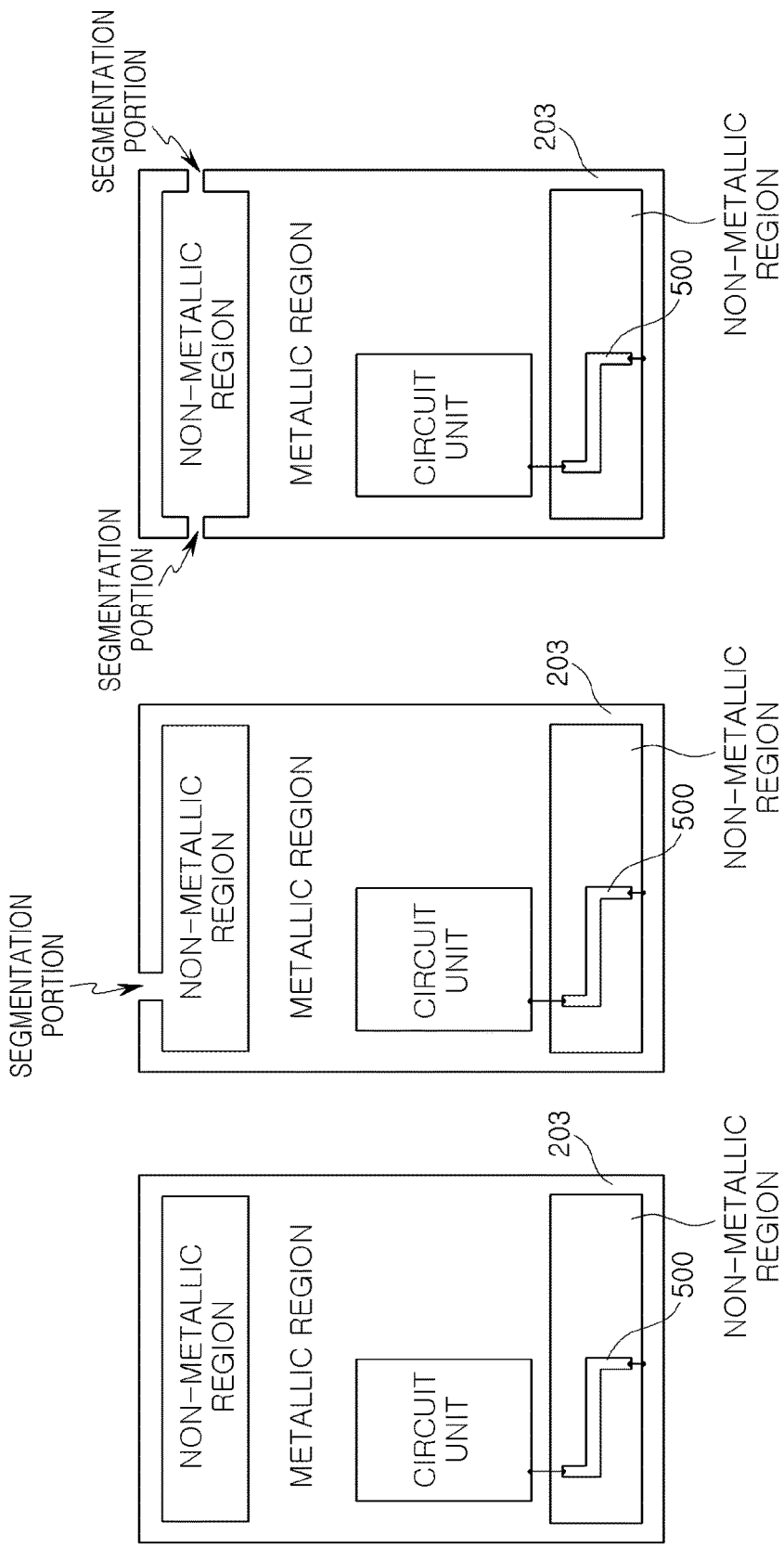

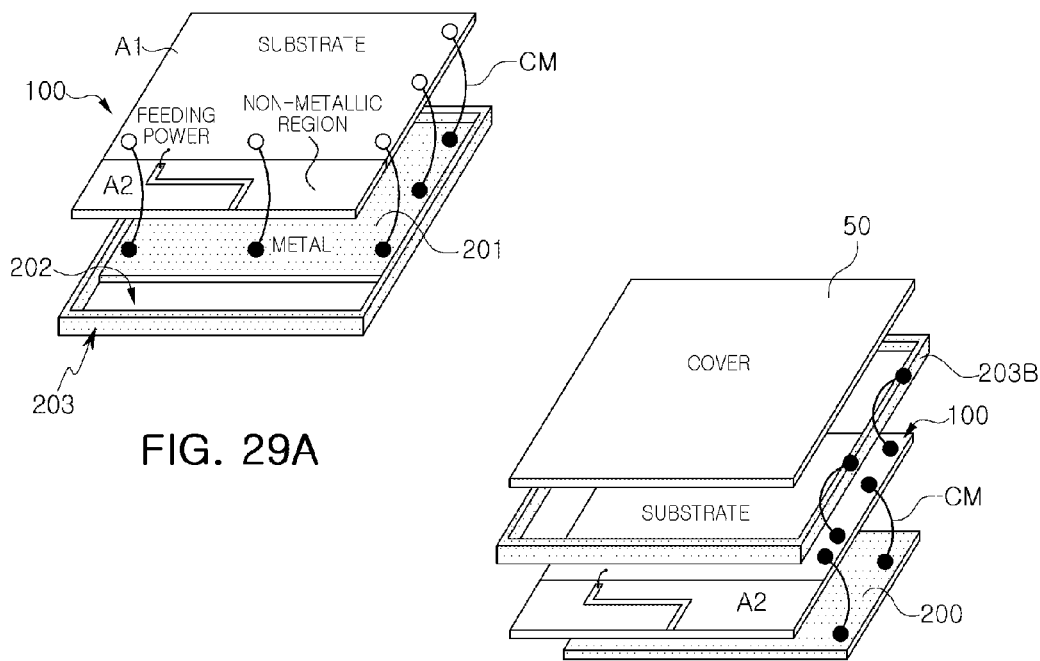
FIG. 29A
FIG. 29C
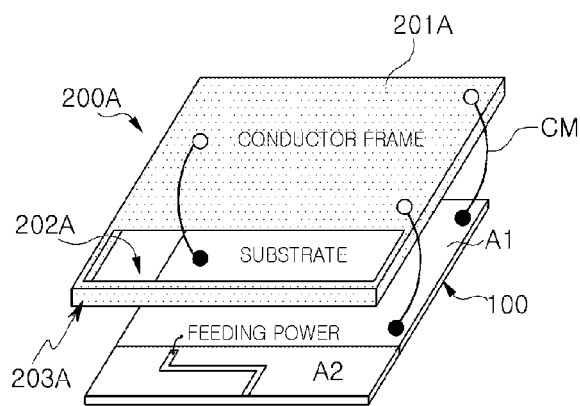
FIG. 29B

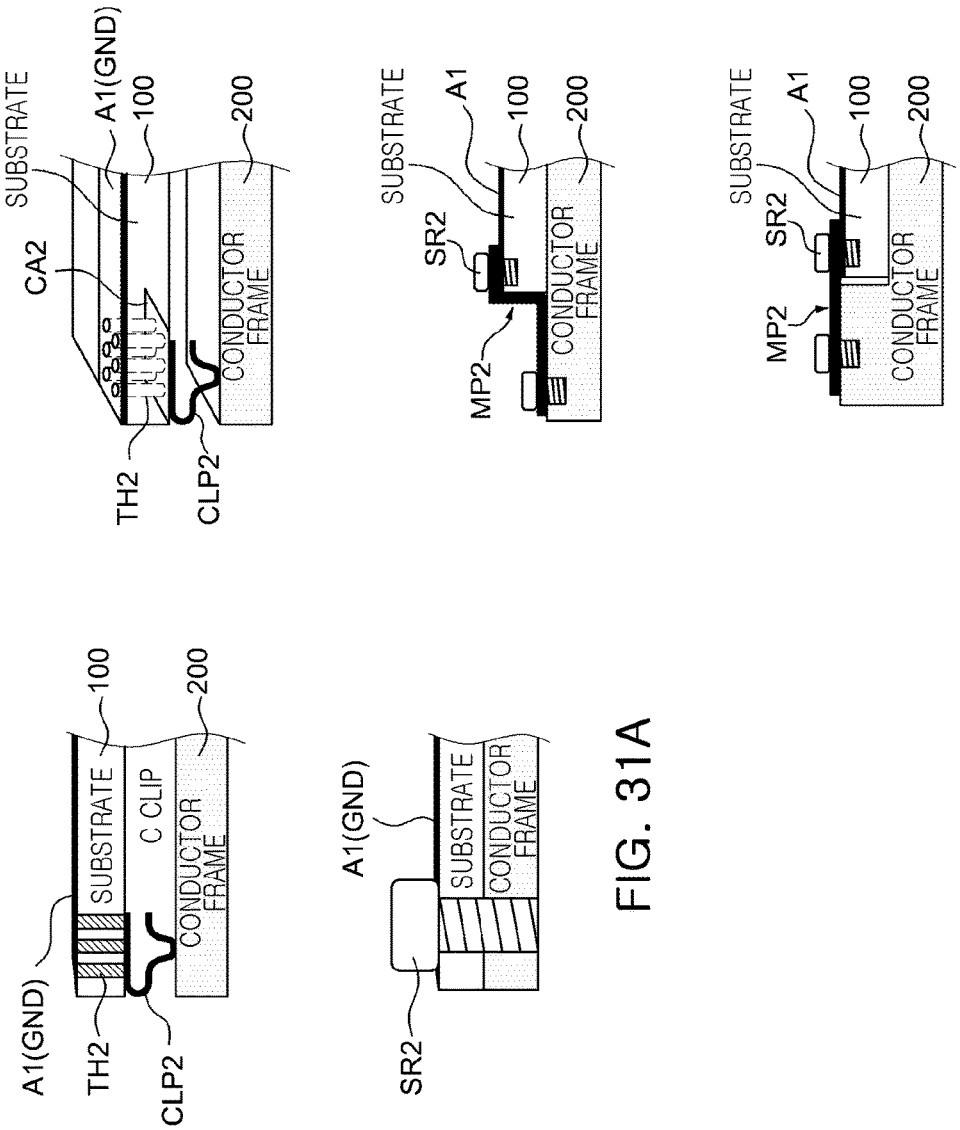

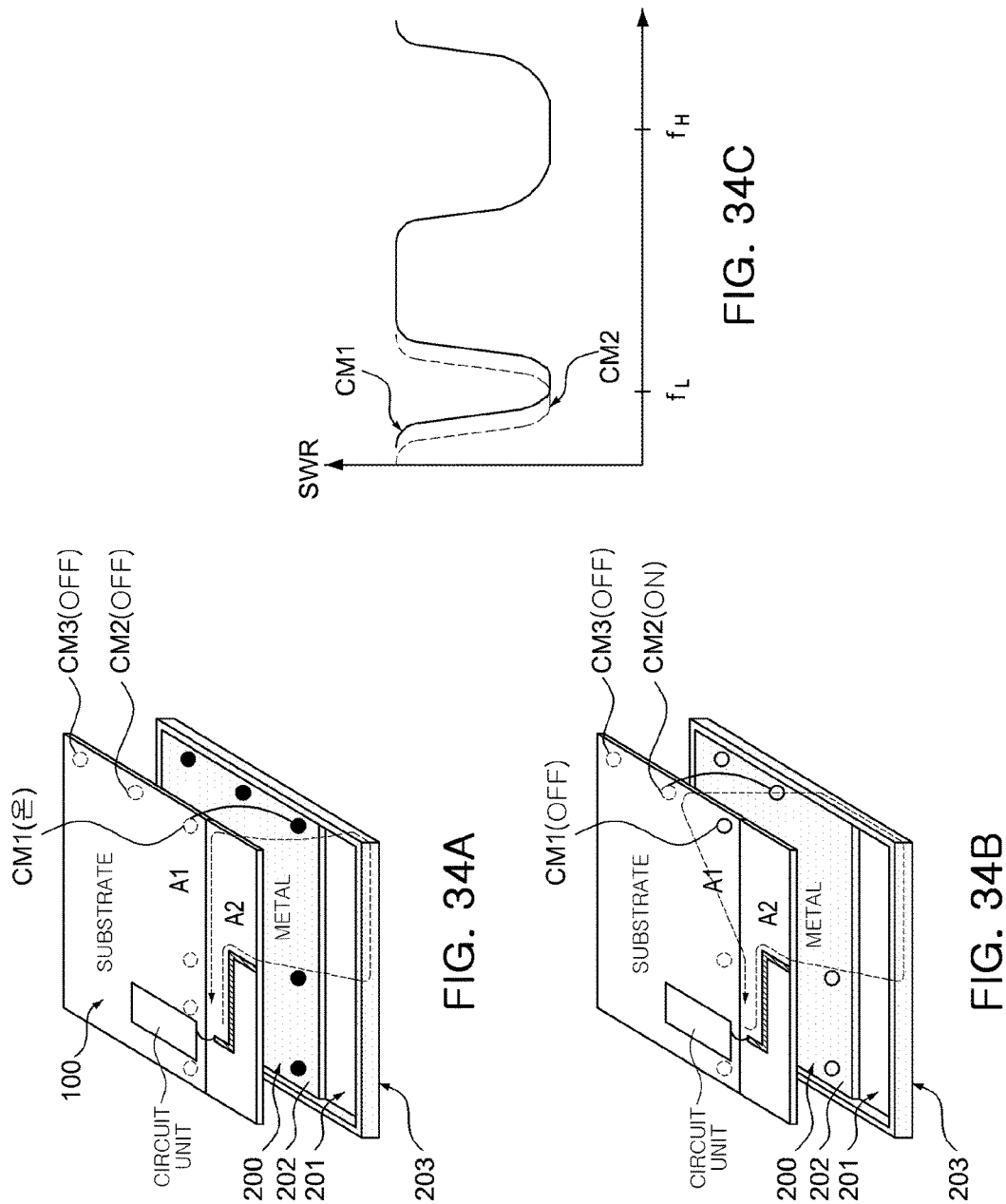

MULTIBAND ANTENNA HAVING EXTERNAL CONDUCTOR AND ELECTRONIC DEVICE INCLUDING THE SAME

CROSS-REFERENCE TO RELATED APPLICATION

This application claims the priorities and benefits under 35 USC 119(a) of Korean Patent Application No. 10-2015-0019538 filed on Feb. 9, 2015, Korean Patent Application No. 10-2015-0031813 filed on Mar. 6, 2015, Korean Patent Application No. 10-2015-0037641 filed on Mar. 18, 2015, Korean Patent Application No. 10-2015-0042153 filed on Mar. 26, 2015, and Korean Patent Application No. 10-2015-0104930 filed on Jul. 24, 2015, with the Korean Intellectual Property Office, the disclosures of which are incorporated herein by reference.

BACKGROUND

1. Field

The following description relates to a multiband antenna using an external conductor of an electronic device.

2. Description of Related Art

The popularity of metal designs for portable electronic devices such as smartphones, has gradually increased. Metal designs are receiving attention to improve an exterior appearance and internal robustness of the portable electronic devices.

For example, in terms of the exterior design of the electronic device, an external conductor is used, and in terms of the internal robustness of the electronic device, a conductor frame is embedded in the electronic device.

Research into a use of external conductors as parts of antennas is being undertaken by some portable electronic device manufacturers.

For example, in existing antennas using the external conductors of portable electronic devices, in order to use such external conductors to transmit information and be part of the antennas, a gap is formed, from which a partial conductor of the external conductor exposed externally is removed, and an end portion of the external conductor segmented by the gap is used as the antenna.

However, in a case in which the external conductor is segmented, disadvantages exist in that the exterior may be unsightly and a low yield may be exhibited in metal machining.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In accordance with an embodiment, there is provided a multiband antenna, including: a conductive connecting member disposed on a non-metallic region of an electronic device; an external conductor disposed on an external surface of the electronic device from a first connecting terminal connected to an end of the conductive connecting member to first and second path terminals, respectively, located opposite to each other; and a conductor frame connected to the first and second path terminals and a ground of a substrate, wherein the external conductor may include a first external radiation conductor disposed between the first path terminal and the first connecting terminal; and a second external radiation conductor integrally formed with the first external radiation conductor and disposed between the second path terminal and the first connecting terminal.

The multiband antenna may also include a first impedance matching unit including one end connected to a feed node of a circuit unit mounted on the substrate and another end connected to the conductive connecting member.

The first external radiation conductor may include an electrical length different from an electrical length of the second external radiation conductor.

The conductive connecting member has an electrical length shorter than an electrical length of the first external radiation conductor or the second external radiation conductor.

The conductive connecting member may be connected to the external conductor to be integrally formed with the external conductor.

The multiband antenna may also include a second impedance matching unit disposed between the conductive connecting member and the first connecting terminal.

The external conductor may be integrally formed with the conductor frame.

The conductor frame may include: a first conductor region connected to a first path terminal of the first external radiation conductor and a first ground node of a circuit unit mounted on the substrate; and a second conductor region connected to a second path terminal of the second external radiation conductor and a second ground node of the circuit unit.

The multiband antenna may also include a third impedance matching unit disposed between both ends of the conductive connecting member and the ground of the substrate.

In accordance with an embodiment, there is provided an electronic device, including: a substrate including a circuit unit; a first impedance matching unit including an end connected to a feed node of the circuit unit; a conductive connecting member disposed on a non-metallic region of the electronic device and including an end connected to another end of the first impedance matching unit; an external conductor disposed on an external surface of the electronic device from a first connecting terminal connected to another end of the conductive connecting member to first and second path terminals, respectively, located opposite to each other; a conductor frame connected to the first and second path terminals of the external conductor and a ground of the substrate; and a display panel configured to display information from the circuit unit, wherein the external conductor may include a first external radiation conductor disposed between the first path terminal of the external conductor and the first connecting terminal to produce a first frequency band, and a second external radiation conductor integrally formed with the first external radiation conductor and disposed between the second path terminal of the external conductor and the first connecting terminal to produce a second frequency band different from the first frequency band.

The first external radiation conductor may include an electrical length different from an electrical length of the second external radiation conductor.

The conductive connecting member may include an electrical length shorter than an electrical length of the first external radiation conductor or the second external radiation conductor.

The conductive connecting member may be connected to the external conductor to be integrally formed with the external conductor.

The electronic device may also include a second impedance matching unit disposed between the conductive connecting member and the first connecting terminal.

The external conductor may be integrally formed with the conductor frame.

The electronic device may also include contact conductor lines connecting a metallic region of the conductor frame and a metallic region of the substrate to each other.

The electronic device may also include a switching device configured to select at least one of the contact conductor lines between the metallic region of the substrate and the conductor frame.

In accordance with an embodiment, there is provided a multiband antenna, including: a conductive connecting member disposed on a non-metallic region of an electronic device; and a external conductor disposed on an external surface of the electronic device, from a first connecting terminal connected to an end of the conductive connecting member to first and second path terminals, respectively, located opposite to each other, and including a first external radiation conductor defining a first current path between the first path terminal and the first connecting terminal to produce a first frequency band, and a second external radiation conductor integrally formed with the first external radiation conductor and defining a second current path between the second path terminal and the first connecting terminal to produce a second frequency band, different from the first frequency band.

The multiband antenna may also include a first impedance matching unit in a feed line between a circuit unit mounted on a substrate and the conductive connecting member.

A current output from the circuit unit of the substrate may form a first current path flowing into a ground of the substrate through the feed line, the first impedance matching unit, the conductive connecting member, and the first external radiation conductor.

The current output from the circuit unit of the substrate may form a second current path flowing into the ground of the substrate through the feed line, the first impedance matching unit, the conductive connecting member, and the second external radiation conductor.

The multiband antenna may also include a conductor frame connecting each of the first and second path terminals of the external conductor to respective grounds of the substrate.

In accordance with another embodiment, there is provided a multiband antenna, including: a conductive connecting member disposed on a region of an electronic device and connected at one end to a circuit unit mounted on a substrate through a feed line; an external conductor disposed on an external surface of the electronic device, from a first connecting terminal connected to another end of the conductive connecting member to first and second path terminals, respectively, disposed at opposite locations from each other; and a conductor frame connecting the first and second path terminals of the external conductor to grounds of the substrate, wherein the external conductor may include a first external radiation conductor defining a first current path between the first path terminal and the first connecting terminal to produce a first frequency band, and a second external radiation conductor integrally formed with the first external radiation conductor and defining a second current path between the second path terminal and the first connecting terminal to produce a second frequency band, different from the first frequency band, and wherein the conductive connecting member is disposed on a same layer as the conductor frame in an air space, and a non-metallic region of the conductor frame is disposed between a cover and a display of the electronic device, integrally formed with the external conductor.

The multiband antenna may also include a first impedance matching unit in a feed line between the circuit unit mounted on a substrate and the conductive connecting member; a second impedance matching unit between the conductive connecting member and the external conductor; and a third impedance matching unit between both ends of the conductive connecting member and one of the grounds of the substrate.

An electrical length of the first radiation conductor may be different from an electrical length of the second conductor to produce the first and second frequency bands between the first and the second radiation conductors.

The electrical length of the first external radiation conductor or the second external radiation conductor, respectively, may be longer than the electrical length of the conductive connecting member to produce different frequency bands between the first external radiation conductor and the second external radiation conductor.

Other features and aspects will be apparent from the following detailed description, the drawings, and the claims.

BRIEF DESCRIPTION OF DRAWINGS

These and/or other aspects will become apparent and more readily appreciated from the following description of the embodiments, taken in conjunction with the accompanying drawings in which:

FIGS. 11A through 11F are diagrams illustrating conductive connecting members in the electronic device, according to an embodiment;

FIGS. 13A through 13C are diagrams illustrating a metallic region, a non-metallic region, and a segmented portion (gap), according to an embodiment;

FIGS. 29A through 29C are diagrams illustrating a contact conductor line of arrangement structures of the electronic device, according to an embodiment;

FIGS. 31A and 31B are diagrams illustrating the contact conductor line, according to an embodiment;

FIGS. 34A through 34C are diagrams illustrating resonance frequency characteristics depending on a passage/non-passage of the contact conductor line, according to an embodiment.

Figure 1:
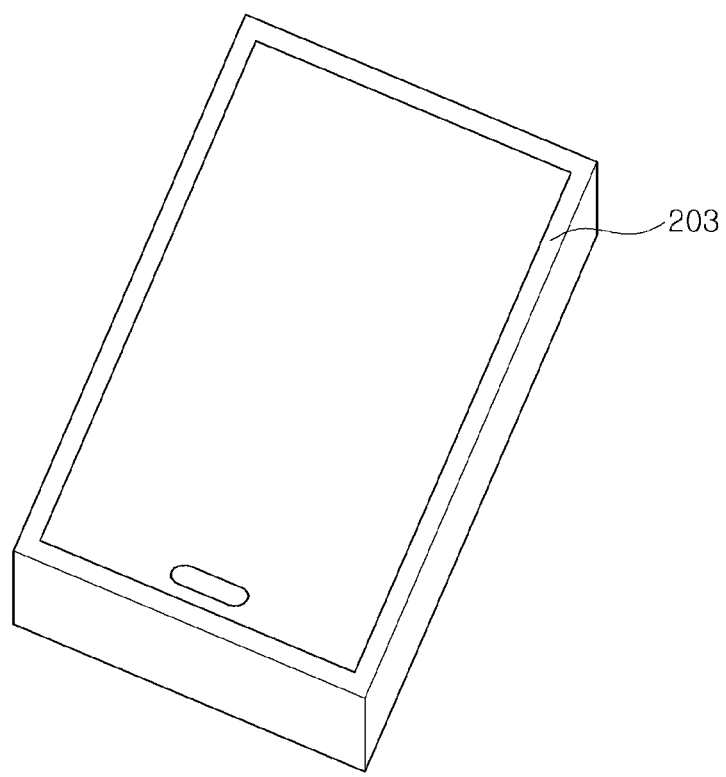
FIG. 1 is a perspective view illustrating an electronic device including a multiband antenna, according to an embodiment.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no elements or layers intervening therebetween. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting of the present inventive concept. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

A multiband antenna, according to an embodiment is operated as the multiband antenna in an electronic device including a substrate and a conductor frame. In this embodiment, one end of a non-segmented external conductor is connected to a circuit unit of the substrate through a conductive connecting member disposed on a non-metallic region in the electronic device. The other end of the non-segmented external conductor is connected to a ground of the substrate through the conductor frame, such that a current in the circuit unit flows through a feed line, the conductive connecting member, an external radiation conductor, and the conductor frame to form a current path for a low frequency band and a current path for a high frequency band which are different from each other. This will be described with reference to the accompanying drawings.

FIG. 1 is a perspective view illustrating an electronic device including a multiband antenna, according to an embodiment.

Referring to FIG. 1, an electronic device 10 including a multiband antenna, according to an embodiment, includes an external conductor 203.

In this example, the external conductor 203, according to an embodiment, is formed integrally with a conductor frame or is separately formed from the conductor frame to be assembled with the electronic device. As an example, the external conductor 203 may or may not be integral to a body of the electronic device 10.

In an embodiment, a gap is not formed in a portion of the external conductor 203 that, at least, functions as the antenna. Thus, the gap may be present in portions of the external conductor 203 that does not function as the antenna.

Figure 2:
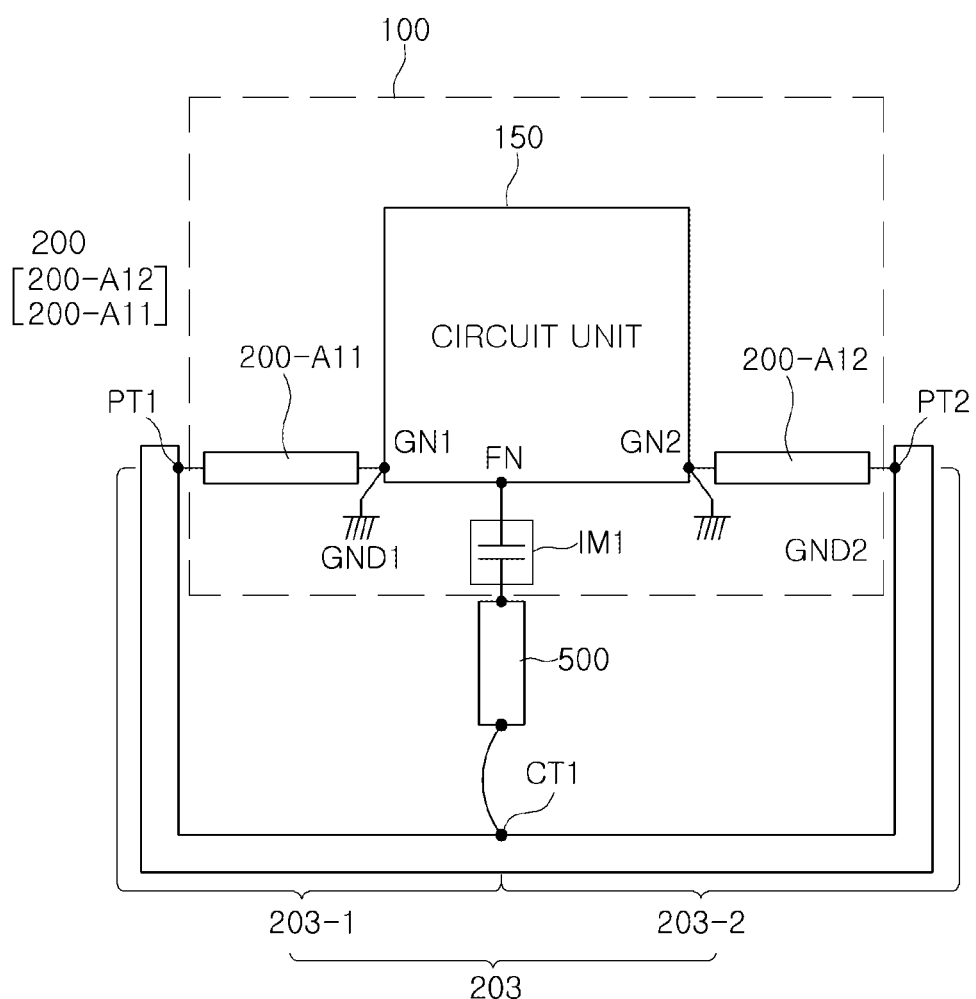
FIG. 2 is a conceptual diagram of a structure of the multiband antenna, according to an embodiment.

FIG. 2 is a conceptual diagram of a structure of the multiband antenna of an electronic device 10, according to an embodiment.

Referring to FIG. 2, the multiband antenna, according to an embodiment, includes a first impedance matching unit IM1, a conductive connecting member 500, the external conductor 203, and a conductor frame 200.

The first impedance matching unit IM1 includes one end connected to a feed node FN of a circuit unit 150 mounted on a substrate 100 of the electronic device 10. The other end of the first impedance matching unit IM1 is connected to the conductive connecting member 500. In an example, as long as the first impedance matching unit IM1 is included in the electronic device 10, the first impedance matching unit IM1 is not limited to a specific position. For example, the first impedance matching unit IM1 may be disposed on the substrate 100.

As an example, the first impedance matching unit IM1 includes at least one a passive device including a capacitor, an inductor, and a resistor.

The conductive connecting member 500 is disposed on a non-metallic region of the electronic device 10, and includes one end electrically connected to the other end of the first impedance matching unit IM1. The other end of the conductive connecting member 500 is electrically connected to the external conductor 203.

The external conductor 203 is disposed on an external surface of the electronic device 10, from a first connecting terminal CT1 connected to the other end of the conductive connecting member 500 to first and second path terminals PT1 and PT2, respectively, disposed at different locations or opposite locations from each other.

As an example, the external conductor 203 is formed integrally with the conductor frame 200 or may be manufactured separately from the conductor frame 200 and assembled together with the conductor frame 200.

As an example, the external conductor 203 includes a first external radiation conductor 203-1 and a second external radiation conductor 203-2.

In this case, the first external radiation conductor 203-1 provides a first current path between the first path terminal PT1, electrically connected to the conductor frame 200, and the first connecting terminal CT1; thus, operating as a radiator at a first frequency band.

Further, the second external radiation conductor 203-2 is formed integrally to the first external radiation conductor 203-1 and provides a second current path between the second path terminal PT2, electrically connected to the conductor frame 200, and the first connecting terminal CT1; thus, operating as a radiator of a second frequency band, different from the first frequency band.

As an example, the first external radiation conductor 203-1 has an electrical length EL1, different from an electrical length EL2 of the second external radiation conductor 203-2 so that the first external radiation conductor 203-1 and the second external radiation conductor 203-2 radiate the frequency bands, which are different from each other. Although a pair of first and second radiation conductors 203-1 and 203-2 are shown to be integral or separate from the conductor frame 200, a person of relevant skill in the art will appreciate that more than two radiation conductors may be implemented to be an integral part or separate from the conductor frame 200. Furthermore, although the electrical lengths EL1 and EL2 are varied to produce different frequency bands between the first and second radiation conductors 203-1 and 203-2, a person skill in the art will appreciate that the electrical or mechanical composition of the first and second radiation conductors 203-1 and 203-2 may be different between both conductors to produce different frequency bands, while the electrical lengths EL1 and EL2 remain the same.

In an embodiment, each of the first external radiation conductor 203-1 and the second external radiation conductor 203-2 are formed of a non-segmented conductor, and the first external radiation conductor 203-1 and the second external radiation conductor 203-2 are formed integrally with each other without a gap therebetween.

The conductive connecting member 500 has an electrical length shorter than the electrical length of each of the first external radiation conductor 203-1 and the second external radiation conductor 203-2.

For instance, in accordance with an embodiment, the electrical length EL1 or EL2 (FIG. 3) of the first external radiation conductor 203-1 or the second external radiation conductor 203-2, respectively, is longer than the electrical length of the conductive connecting member 500 so that each of the first external radiation conductor 203-1 and the second external radiation conductor 203-2 function as a main radiator of the antenna to produce different frequency bands.

The conductive connecting member 500 is connected to the first connecting terminal CT1 of the external conductor 203 through an electrical connection structure, by way of example. As another example, the conductive connecting member 500 is physically connected to the external conductor 203 to be formed integrally with the external conductor.

As shown in FIG. 1, the conductor frame 200 is electrically connected to each of the first and second path terminals PT1 and PT2 of the external conductor 203, and grounds GND1 and GND2 of the substrate 100. According to various embodiments, the conductor frame 200 is a metal cover of the electronic device 10 (see FIGS. 5A and 5B), or is the conductor frame embedded in the electronic device 10 (see FIGS. 4A and 4B).

Figure 4A:
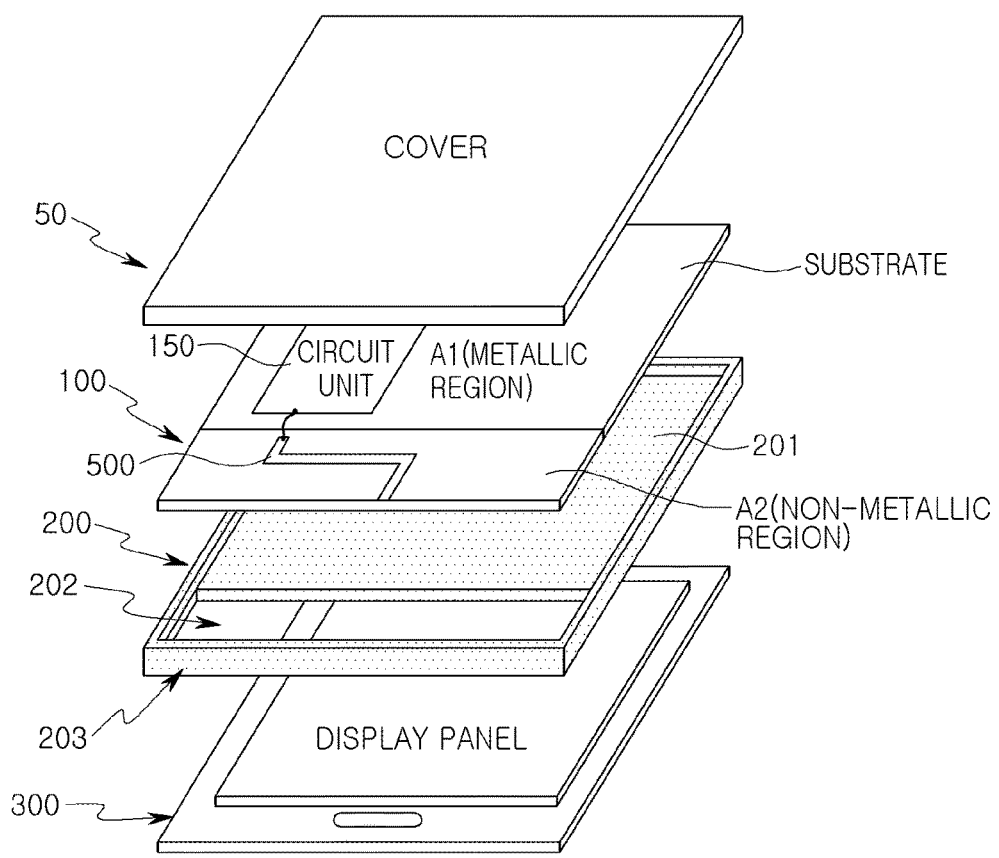
FIGS. 4A and 4B are an exploded perspective view and a cross-sectional view of a coupled state of the electronic device including the multiband antenna, according to an embodiment.
Figure 4B:
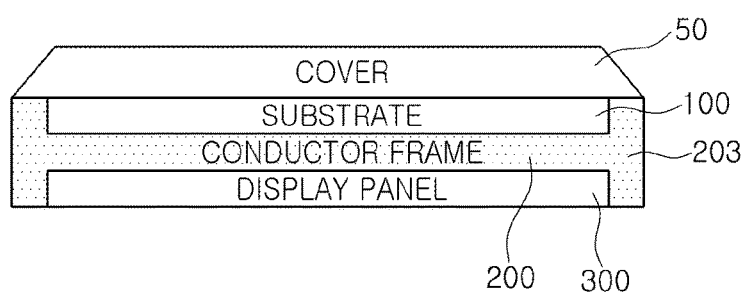

According to various embodiments, as shown in FIGS. 4A and 4B, in an example in which the conductor frame 200 in the electronic device 10 is used as the conductor frame, a cover may be further included. In this case, the cover may be a metal cover or a non-metal cover in which at least a portion thereof includes a conductor.

Further, as long as the conductor frame 200 electrically connects each of the first and second path terminals PT1 and PT2 of the external conductor 203 and the grounds GND1 and GND2 of the substrate 100 to each other, the conductor frame 200 is not limited to the metal cover or the conductor frame.

As an example, the conductor frame 200 includes a first conductor region 200-A11 and a second conductor region 200-A12. In this case, the first conductor region 200-A11 is electrically connected to the first path terminal PT1 of the first external radiation conductor 203-1 and a first ground node GN1 of the circuit unit 150, respectively. Thus, the first conductor region 200-A11 provides a first current path PH1 between the first path terminal PT1 of the first external radiation conductor 203-1 and the first ground node GN1 of the circuit unit 150.

Further, the second conductor region 200-A12 is electrically connected to the second path terminal PT2 of the second external radiation conductor 203-2 and a second ground node GN2 of the circuit unit 150, respectively. Thus, the second conductor region 200-A12 provides a second current path PH2 between the second path terminal PT2 of the second external radiation conductor 203-2 and the second ground node GN2 of the circuit unit 150.

In an example, each of the first conductor region 200-A11 and the second conductor region 200-A12, a region providing the first and second current paths PH1 and PH2, respectively, is a fixed region, but may be a region that varies at least one path of the first and second current paths PH1 and PH2 as described below.

Figure 3:
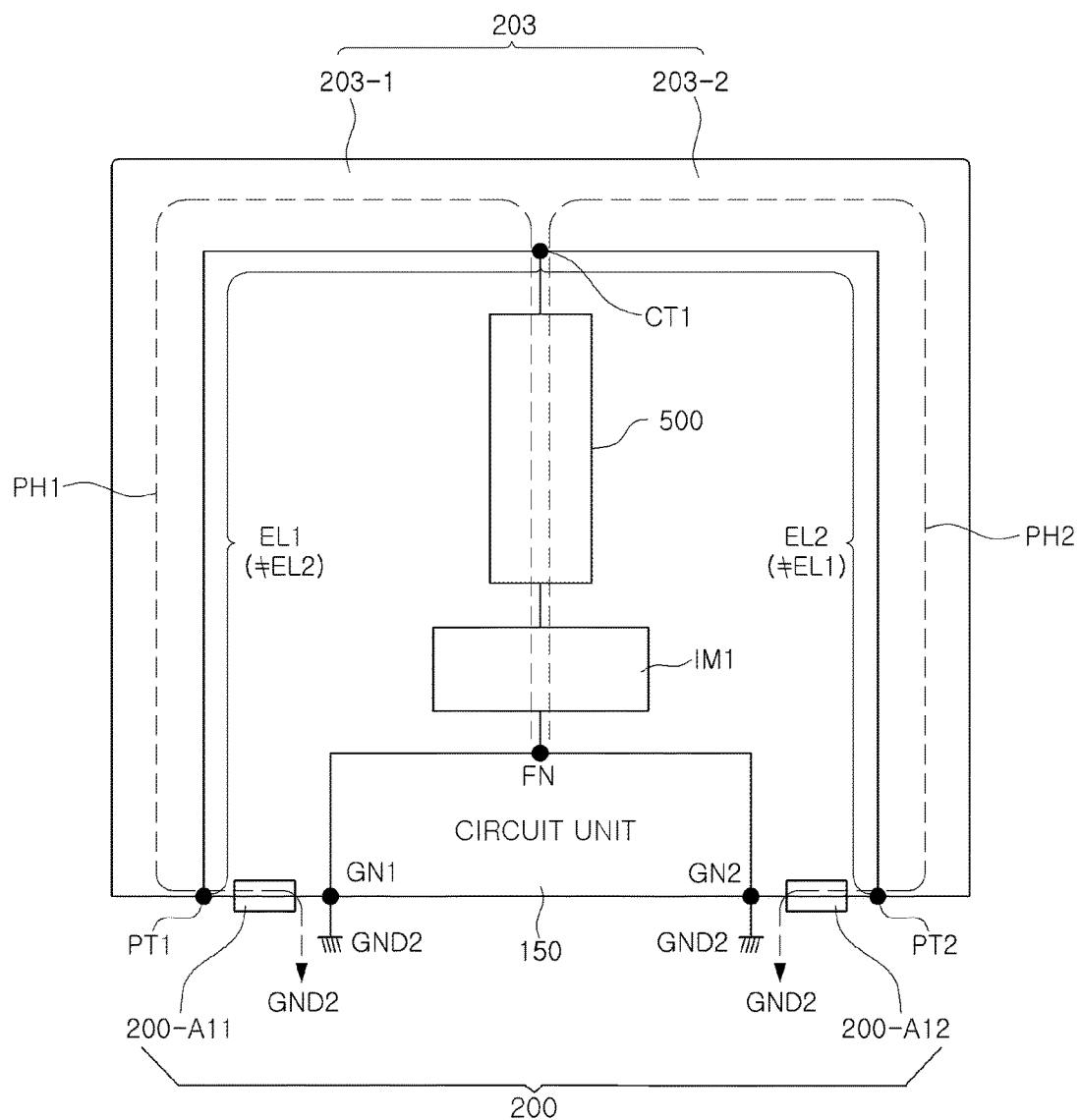
FIG. 3 is a conceptual diagram of an operation of the multiband antenna, according to an embodiment.

FIG. 3 is a conceptual diagram of an operation of the multiband antenna, according to an embodiment.

Referring to FIG. 3, the multiband antenna, according to an embodiment, includes the first impedance matching unit IM1, the conductive connecting member 500, the external conductor 203, and the conductor frame 200.

Among the descriptions of the first impedance matching unit IM1, the conductive connecting member 500, the external conductor 203, and the conductor frame 200 illustrated in FIG. 3, overlapped descriptions the same as the description provided with reference to FIG. 2 will be omitted.

Referring to FIG. 3, the first current path PH1, a current path corresponding to the first frequency band, is formed between the feed node FN of the circuit unit 150, the first impedance matching unit IM1, the conductive connecting member 500, the first external radiation conductor 203-1, the first conductor region 200-A11 of the conductor frame 200, and a first ground GND1 of the substrate 100.

Further, the second current path PH2, a current path corresponding to the second frequency band, is formed between the feed node FN of the circuit unit 150, the first impedance matching unit IM1 the conductive connecting member 500, the second external radiation conductor 203-2, the second conductor region 200-A12 of the conductor frame 200, and a second ground GND2 of the substrate 100.

Although the first current path PH1 and the second current path PH2 are defined by the nodes, grounds, and structural elements listed above, a person skill in the art will appreciate that less or additional nodes, grounds, and structural elements may be included along the paths defining the first and the second current paths PH1 and PH2.

In addition, in one configuration, an electrical length of the first current path PH1 and an electrical length of the second current path PH2 may be different from each other. As a result, the multiband antenna having frequency bands that are different from each other may be implemented.

Figure 5A:
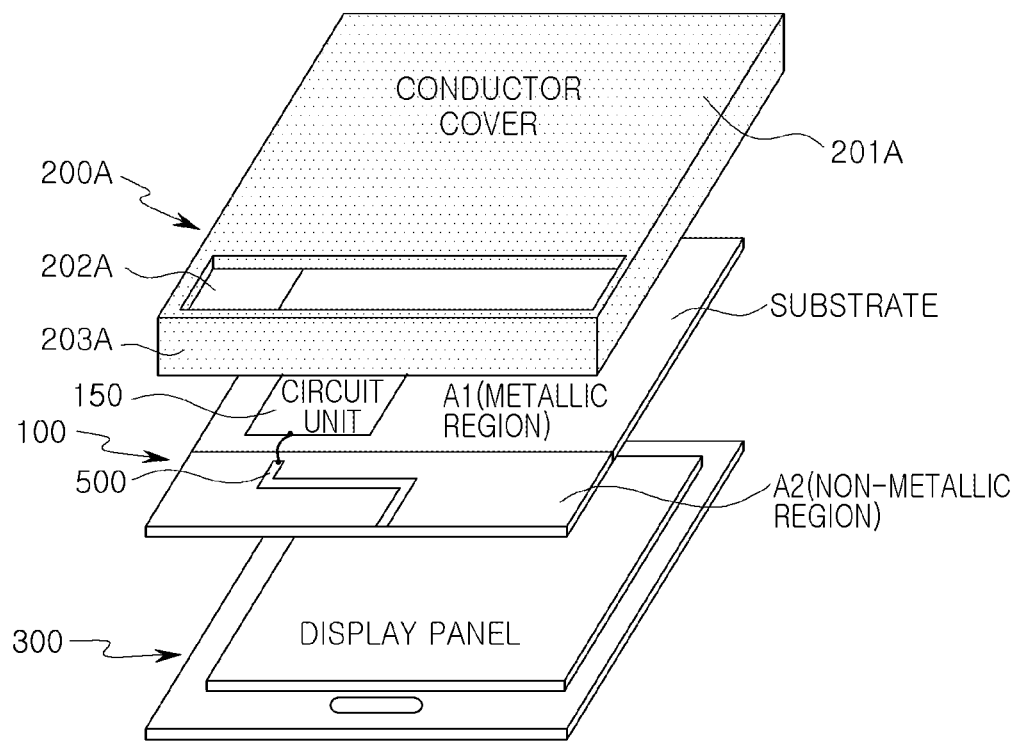
FIGS. 5A and 5B are a partially-exploded perspective view and a cross-sectional view of a coupled state of the electronic device including the multiband antenna, according to an embodiment.
Figure 5B:
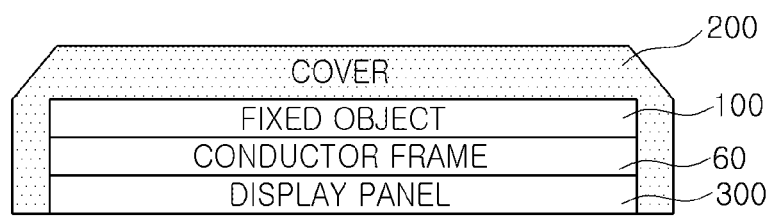

Further, as an example shown in FIGS. 5A and 5B, the conductor frame 200 is a conductor cover of the electronic device 10. In an alternative embodiment, the conductor frame 200 is the conductor frame disposed in the electronic device 10 (see FIGS. 4A and 4B). As such, as long as the conductor frame 200 is electrically connected to the external conductor 203 and the ground GND1 and GND2 of the substrate 100, the conductor frame 200 is not limited to a specific component of the electronic device.

According to an embodiment, the external conductor 203 has a size sufficient to surround sides of the electronic device so that internal components such as the substrate 100, a display panel, and other components are not externally exposed from the electronic device 10 assembly.

In the following FIGS. 4 through 13, in order to briefly illustrate, the first impedance matching unit IM1 disposed between the circuit unit 150 and the conductive connecting member 500 is omitted. However, a person of skill in the art will appreciate that the configurations or embodiments described and illustrated in FIGS. 4 and 13 may be modified to also include the features of the first impedance matching unit IM1, as well as, other structural components that may be included in the in the non-metallic region, the external conductor 203, the conductor frame 200, the circuit unit 150, or the substrate 100.

FIGS. 4A and 4B are an exploded perspective view and a cross-sectional view of a coupled state of the electronic device including the multiband antenna, according to an embodiment.

Referring to FIGS. 4A and 4B, the electronic device 10 includes a cover 50, the substrate 100, the conductor frame 200, and a display panel 300.

In this case, the electronic device 10 employing the multiband antenna includes the cover 50 and the substrate 100. The substrate 100 is disposed inside the cover 50 to include the circuit unit 150. In an example, the circuit unit 150 includes, for example, a central processing unit (CPU), an image signal processor (ISP), a controller, a memory, a communications unit, and an input and output interface, in order to support functions necessary for an operation of the electronic device 10. Further, the circuit unit 150 may have a ground electrically connected to the ground of the substrate 100, where the ground provides a reference potential during an operation.

As an example, the cover 50, the substrate 100, the conductor frame 200, and the display panel 300 are sequentially disposed as illustrated in FIG. 4A, but are not limited thereto.

The substrate 100 includes a metallic region (conductive region) A1 and a non-metallic region (non-conductive region) A2. In one illustrative example, at least a portion of the circuit unit 150 is disposed on the metallic region (conductive region) A1 and the conductive connecting member 500 is disposed on the non-metallic region A2. In an example, the ground to maintain a reference potential of the substrate 100 is disposed on the metallic region A1.

In accord with an embodiment, although the metallic region A1 of the substrate 100 is described as the ground, an overall region of the metallic region A1 of the substrate 100 is not necessarily the ground. A portion of the metallic region A1 of the substrate 100 may be also embodied to be the ground.

The conductor frame 200 is a metal cover or an internal conductor frame. As an example, the conductor frame 200 is a frame that is rigid and supports an internal structure including the substrate 100 of the electronic device 10. The conductor frame 200 includes a metallic region 201 and a non-metallic region 202. In addition, the conductor frame 200 is integrally formed with the external conductor 203.

As an example, a portion of or all of the metallic region 201 is formed of a metal, or a portion of or all of a surface of the conductor frame 200 may also be formed of a metallic material. The non-metallic region 202 is an empty space, such as, air, from which a portion of the metal is removed, and may also be formed of a non-metallic material, such as plastic or a polyurethane material.

The external conductor 203, a non-segmented external conductor of the external conductor exposed externally of the electronic device 10, is formed of a non-segmented conductive material to function as a main radiator of the antenna. In this embodiment, the external conductor 203 has a height equal to that of a surface height of the metallic region 201 of the conductor frame 200 and has a height different from the surface height of the metallic region 201.

As an example, the external conductor 203 includes a step higher than the surface height of the metallic region 201 to accommodate the substrate 100 together with the conductor frame 200, as illustrated in FIG. 4A.

The display panel 300 displays information from the circuit unit 150 of the substrate on a screen. In an example, the information displayed on the display panel 300 is information related to an operation of the electronic device and/or information selected by a user.

In this example, the other end of the conductive connecting member 500 is electrically connected to the first connecting terminal CT1 (FIG. 1) of the external conductor 203. The one end of the conductive connecting member 500 is connected to the feed node FN (FIGS. 2 and 3) of the circuit unit 150 of the substrate 100 through the first impedance matching unit IM1 (FIGS. 2 and 3) to feed power to the circuit unit 150.

In an embodiment, the conductive connecting member 500 transfers a current (or signal) from the feed node FN of the circuit unit 150 to the external conductor 203.

FIGS. 5A and 5B are a partially-exploded perspective view and a cross-sectional view of a coupled state of the electronic device including the multiband antenna, according to an embodiment.

Referring to FIGS. 5A and 5B, the electronic device 10 includes a cover or a conductor frame 200A corresponding to the conductor cover 200, an external conductor 203A, the substrate 100, and the display panel 300. In this case, the conductor frame 200A, the substrate 100, and the display panel 300 are sequentially disposed as illustrated in FIG. 5A, but are not limited thereto. A person of ordinary skill in the art will appreciate that additional substrate layers may be included between the conductor frame 200A, the substrate 100, and the display panel 300.

In this example, the conductor frame 200A includes a metallic region 201A and a non-metallic region 202A, and is integrally formed with the external conductor 203A. The external conductor 203A is disposed outside the conductor frame 200A, the conductor cover, to surround the substrate 100 and the display panel 300 from an outside of the electronic device 10, as illustrated in FIG. 5B.

A portion of or the entirety of the metallic region 201A is formed of a metal, or a portion of or the entirety the surface of the conductor frame 200*a* may also be formed of a conductive material and may, at least, partially include the conductive material. The non-metallic region 202A is an empty space, such as, air, from which a portion of the metal is removed, or is formed of a non-metallic material, such as plastic or a polyurethane material, as described above.

The external conductor 203A, a non-segmented external conductor of the external conductor exposed externally to the electronic device 10, is formed of a non-segmented conductive material in order to perform a function of a main radiator of the antenna. In this case, the external conductor 203A has a height equal to that of a surface height of the metallic region 201A of the conductor frame 200A and has a height different from the surface height of the metallic region 201A.

As an example, as illustrated in FIG. 5A, the external conductor 203A includes a step higher than the surface height of the metallic region 201A to accommodate the substrate 100 by cooperating with the conductor frame 200A, the conductor cover.

Furthermore, in FIG. 5B, a fixed object 60 is formed of a non-conductive material, such as plastic, or a conductive material, and may be formed of a material or in a rigid shape to support an internal structure of the electronic device 10 including the substrate 100.

Referring to FIGS. 4A through 5B, as in the electronic device including the multiband antenna, according to an embodiment, an order in which the cover, the substrate, the conductor frame, and the display panel are coupled to each other and are disposed may be variously modified, which will be described with reference to FIGS. 6 through 9.

Figure 6:
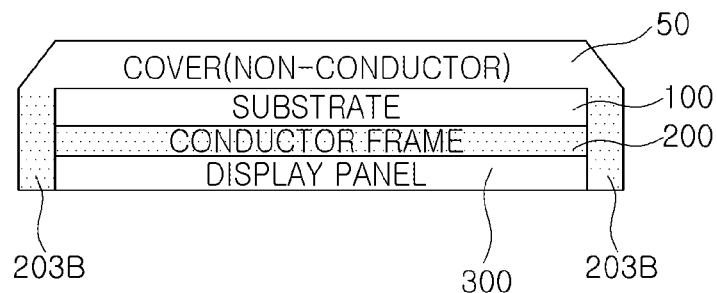
FIG. 6 is a cross-sectional view of the coupled state of the electronic device including the multiband antenna, according to an embodiment.

FIG. 6 is a cross-sectional view of the coupled state of the electronic device including the multiband antenna, according to an embodiment.

Referring to FIG. 6, the electronic device 10 is embodied in an order of the cover 50, such as a non-conductor, the substrate 100, the conductor frame 200, and the display panel 300. In this case, an external conductor 203B is electrically connected to the conductor frame 200.

As an example, referring to FIGS. 5 and 6, the cover 50 is formed integrally with the external conductor 203B by insert injection molding, by way of example.

Figure 7:
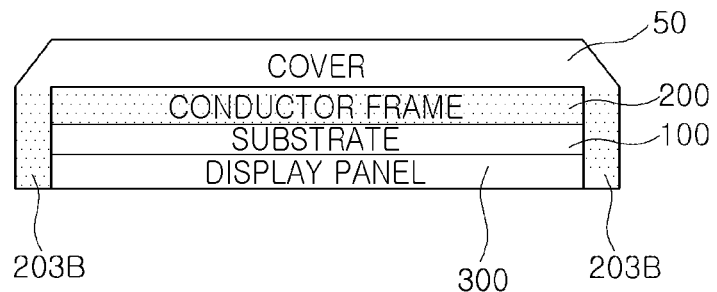
FIG. 7 is a cross-sectional view of the coupled state of the electronic device including the multiband antenna, according to an embodiment.

FIG. 7 is a cross-sectional view of the coupled state of the electronic device including the multiband antenna according to an embodiment.

Referring to FIG. 7, the electronic device 10 is coupled so as to be disposed in order of the cover 50, the non-conductor, the conductor frame 200, the substrate 100, and the display panel 300. As an example, the cover 50 is formed integrally with the external conductor 203B through an injection molding of an insert manner, or the like.

In an embodiment, a method to manufacture the external conductor 203B is not particularly limited. For example, the external conductor 203B may be manufactured through fabrication.

Figure 8:
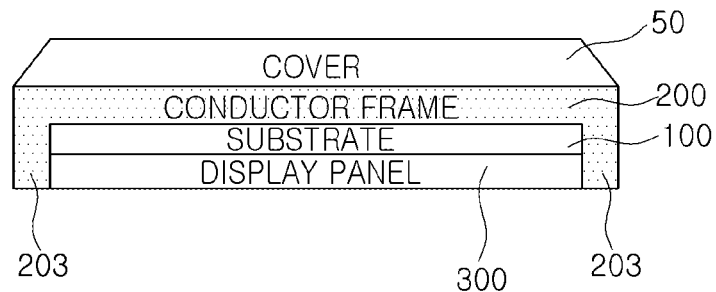
FIG. 8 is a cross-sectional view of the coupled state of the electronic device including the multiband antenna, according to an embodiment.

FIG. 8 is a cross-sectional view of the coupled state of the electronic device including the multiband antenna, according to an embodiment.

Referring to FIG. 8, the electronic device 10 is coupled so as to be disposed in order of the cover 50, the non-conductor, the conductor frame 200, the substrate 100, and the display panel 300. As an example, the conductor frame 200 is integrally formed with the external conductor 203.

Referring to FIGS. 4 through 8 described above, it is described and illustrated that the external conductors 203, 203A, and 203B are integrally formed with the non-mental or metal cover, or are integrally formed with the internal conductor frame 200. Unlike this, however, after each of the external conductor 203, the cover, and the conductor frame is separately manufactured, to be later assembled together with other structural elements of the electronic device 10.

Figure 9:
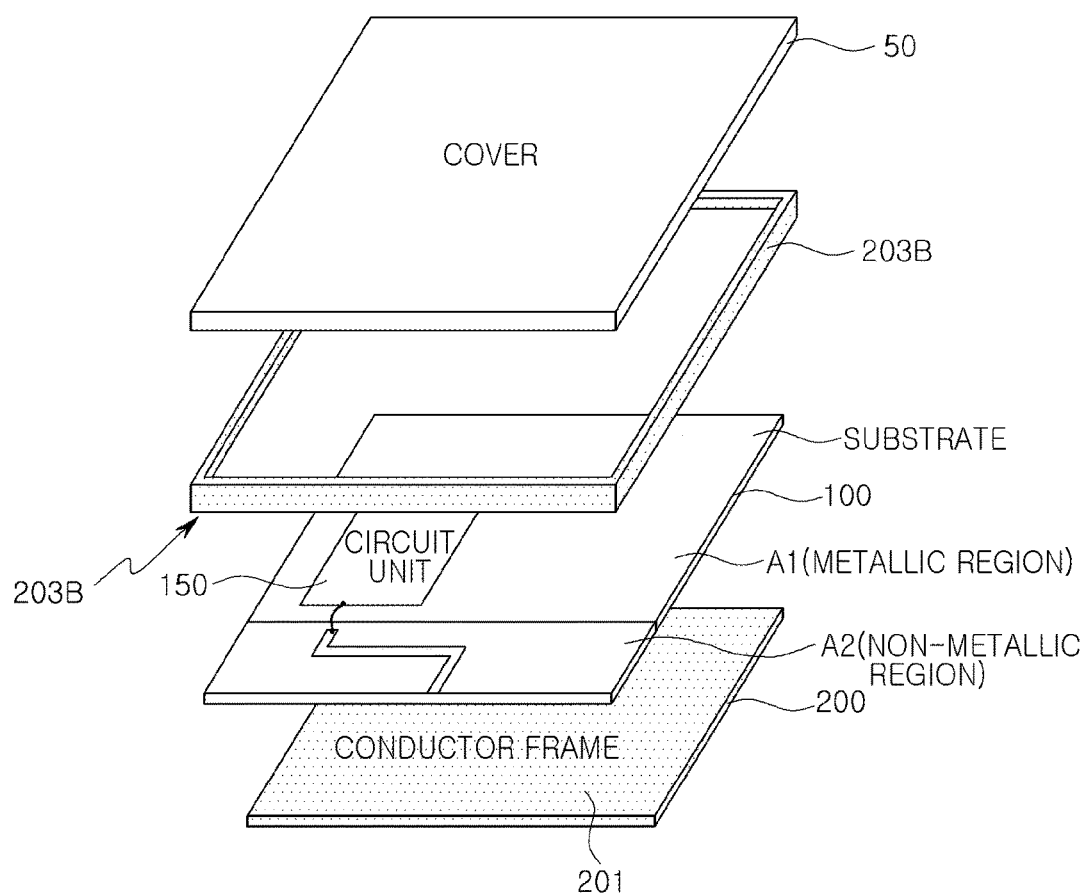
FIG. 9 is a partially-exploded perspective view of the electronic device including the multiband antenna, according to an embodiment.

FIG. 9 is a partially-exploded perspective view of the electronic device including the multiband antenna according to an embodiment.

Referring to FIG. 9, the electronic device is coupled so as to be disposed in order of the cover 50, the substrate 100, and the conductor frame 200.

As an example, the external conductor 203B is separately formed from the cover 50 or the conductor frame 200, and is disposed outside the substrate 100 and the conductor frame 200 after the assembly of the electronic device and are coupled thereto.

In FIG. 9, the conductor frame 200 includes the metallic region 201 and excludes the non-metallic region, by way of example, in the case in which the conductor frame 200 is separately manufactured from the external conductor 203B.

As described above, in the electronic device, according to an embodiment, the conductive connecting member 500 is disposed on the non-metallic region A2 of the substrate 100, or is disposed on a component of a layer different from the substrate 100. For example, the conductive connecting member 500 is disposed on the cover 50 or the conductor frame 200, different from the substrate 100.

As such, as long as the conductive connecting member 500 is disposed on the non-metallic region A2, which does not include the conductive material or is disposed in a position at least partially overlapping with the non-metallic region A2 in the electronic device 10, a position at which the conductive connecting member 500 is disposed is not limited to a specific layer, or member, or component.

Figure 10A:
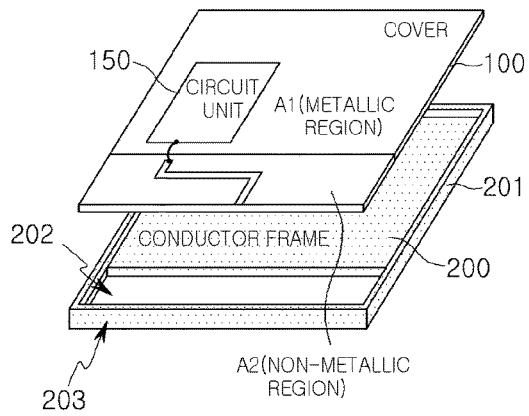
FIGS. 10A through 10D are diagrams illustrating non-metallic regions for various metallic regions in the electronic device, according to an embodiment.
Figure 10B:
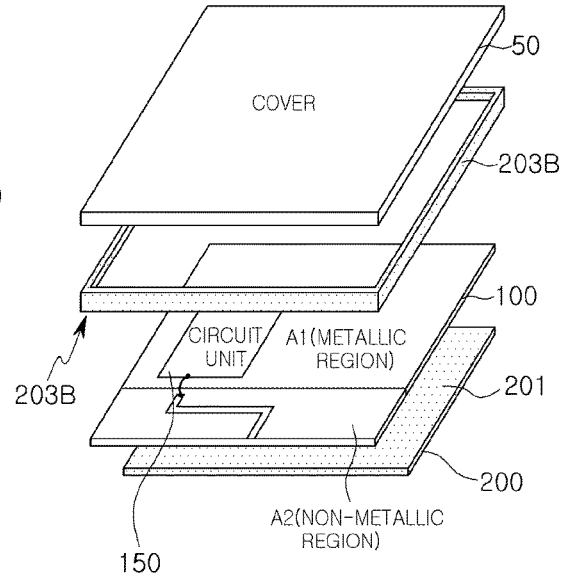
Figure 10C:
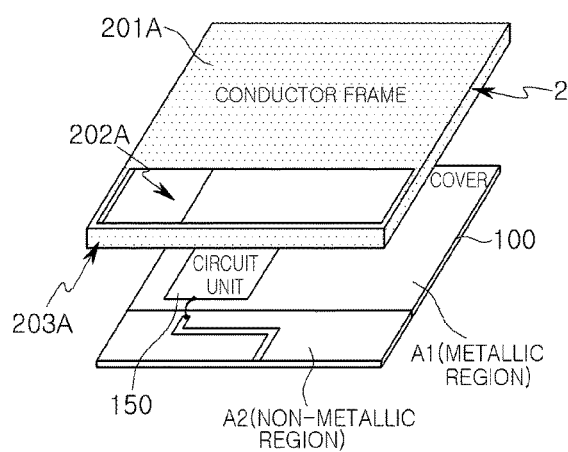
Figure 10D:
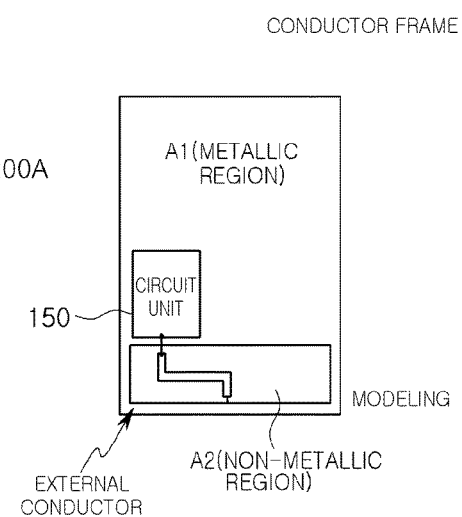

FIGS. 10A and 10D are diagrams illustrating non-metallic regions for various metallic regions in the electronic device, according to an embodiment.

FIG. 10A illustrates a structure in which the external conductor 203 is integrally formed with the conductor frame 200, in a structure in which the substrate 100 and the conductor frame 200 are vertically disposed.

FIG. 10B illustrates a structure in which the external conductor 203B is separately manufactured to be arranged and assembled, in a structure with an arrangement of the cover 50, the substrate 100, and the conductor frame 200.

FIG. 10C illustrates a structure in which the external conductor 203A is integrally formed with the conductor frame 200A, in a structure in which the conductor frame 200A, a conductive cover, and the substrate 100 are vertically disposed.

In this case, the conductor frame 200A includes a metallic region 201A and a non-metallic region 202A.

As illustrated in FIGS. 10A, 10B, and 10C described above, according to various embodiments, in a case in which the conductive region A1 of the substrate 100 is electrically connected to the conductor frame 200 or 200A, or the external conductor 203, 203A, or 203B, the metallic region illustrated in FIG. 10D is modeled into a region including a plurality of conductive materials, which may be electrically connected to each other. For example, all of the conductive portions, such as the fixed object fixing the electronic device, the conductor frame 200, and the external conductor 203, and a conductive portion of the substrate are modeled into the region including the conductive materials.

The metallic region (or conductive region) in various embodiments is a region including all of the conductive portions, such as the conductor frame, or the external conductor, electrically connected to the metallic region of the substrate, as illustrated in FIG. 10D.

In an example, a region formed of the remaining non-metal except for the metallic region of the electronic device is referred to as the non-metallic region.

Meanwhile, the conductive connecting member 500 according to an embodiment is formed of at least one pattern. For example, the conductive connecting member 500 is formed of one conductive connecting member or is formed of two or more conductive connecting members.

In addition, as long as the conductive connecting member 500 transfers or transmits the signal or the current from the circuit unit 150 to the external conductor 203, the conductive connecting member 500 is not limited to a specific shape. Several examples in which the conductive connecting member 500 is formed in various shapes will be described with reference to FIG. 11.

FIGS. 11A and 11F are diagrams illustrating conductive connecting members in the electronic device, according to an embodiment.

FIG. 11A illustrates the conductive connecting member 500 including first and second conductive connecting members 510 and 520, which are physically separated from each other. The respective one ends of the first and second conductive connecting members 510 and 520 illustrated in FIG. 11A are commonly connected to one feed line that connects to the circuit unit, and corresponding other ends of the first and second conductive connecting members 510 and 520 are connected to the first and second connecting terminals CT1 and CT2 disposed in different locations to each other of the external conductor.

In this case, because the current paths are formed by the conductive connecting members 510 and 520, a cover band of the antenna is changed by the conductive connecting members 510 and 520.

FIG. 11B illustrates the conductive connecting member 500 and a ground pattern 400. One end of the conductive connecting member 500 is connected to the feed line of the circuit unit, and the other end thereof is connected to the first connecting terminal CT1 of the external conductor. The ground pattern 400 is formed of a conductive pattern disposed to be adjacent to the conductive connecting member 500. One end of the ground pattern 400 is connected to the ground of the substrate and the other end thereof is connected to the second connecting terminal CT2 of the external conductor.

Further, the conductive connecting member 500 and the ground pattern 400 are adjacent to each other so as to form an electromagnetic coupling, such as a capacitance coupling, by way of example, as illustrated in FIG. 11B. Alternatively, the conductive connecting member 500 and the ground pattern 400 are electrically and directly connected to each other through a wire.

As such, in a case in which the ground pattern 400 is added, because impedance on the current path may be changed, the cover band of the antenna may be changed.

FIG. 11C illustrates the conductive connecting member 500 having one branch member. One end of the conductive connecting member 500 illustrated in FIG. 11C is connected to the feed line of the circuit unit, and the other end thereof is connected to the first connecting terminal CT1 of the external conductor. Further, a branch member 501 between one end of the conductive connecting member 400 and the other end thereof is connected to the ground of the substrate.

FIG. 11D illustrates the conductive connecting member 500 having an "h" shape and including three terminals. One terminal of the conductive connecting member 500 illustrated in FIG. 11D is connected to the circuit unit through one feed line, and the remaining two terminals are connected to each of the first and second connecting terminals CT1 and CT2, at the locations different from each other of the external conductor.

In this embodiment, as the current path is diversified and the impedance on the current path is changed, the cover band is diversified as needed. The above-mentioned description may be applied to various embodiments.

FIG. 11E illustrates the conductive connecting member 500 formed of a conductive member having a polygonal shape, such as a quadrangular shape. One point of the conductive connecting member 500 illustrated in FIG. 11E is connected to the circuit unit through one feed line, and two points different from each other are connected to the first and second connecting terminals CT1 and CT2, disposed at different locations from each other to the external conductor.

FIG. 11F illustrates the conductive connecting member 500 having a polygonal shape, in which a slit is formed.

Referring to FIG. 11F, the conductive connecting member 500 includes the slit removed from the polygonal shape conductive member. One point of the conductive connecting member 500 illustrated in FIG. 11F is connected to the circuit unit through the feed line, and two points different from each other are connected to the first and second connecting terminals CT1 and CT2, which are disposed in different locations to the external conductor.

In this case, because the current path is different from each other, the cover band of the antenna is diversified.

Figure 12:
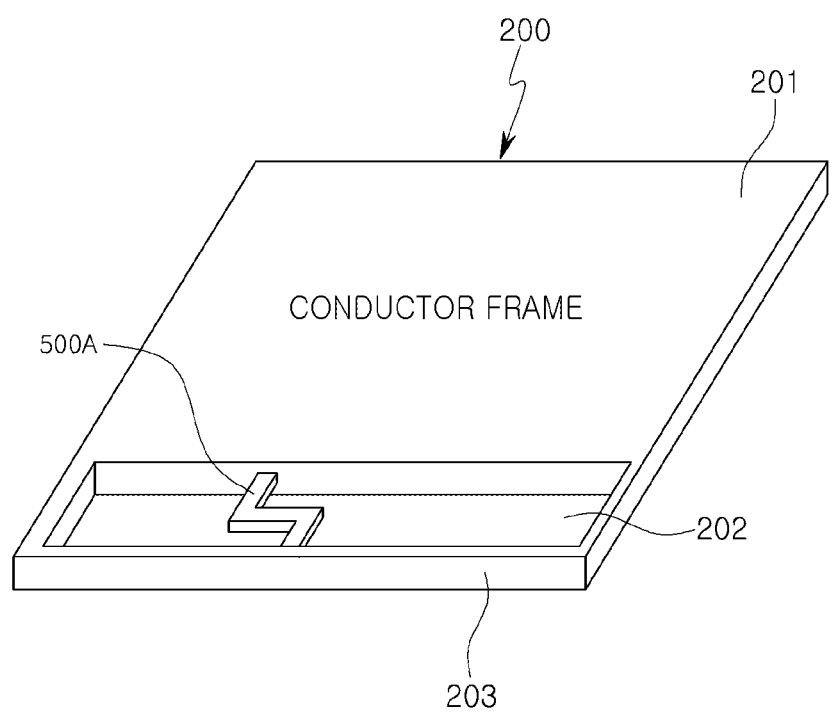
FIG. 12 is a perspective view of a conductor frame of the electronic device including the multiband antenna, according to an embodiment.

FIG. 12 is a perspective view of the conductor frame of the electronic device including the multiband antenna according to an embodiment.

Referring to FIG. 12, the conductive connecting member 500A is disposed on the same layer as the conductor frame 200 in an air space. The non-metallic region 202 of the conductor frame 200 is disposed between the cover and a display of the electronic device, so as to be integrally formed with the external conductor 203.

In an embodiment, one end of the conductive connecting member 500A is electrically connected to the circuit unit of the substrate 100 through a feed line, and another end of the conductive connecting member 500A is electrically connected to the external conductor 203.

Furthermore, gap is not formed or is excluded in a portion of the external conductor 203, according to an embodiment, which at least functions as the antenna. The gap may be present in a portion of the external conductor 203 that does not function as the antenna. This will be described with reference to FIGS. 13A through 13C.

FIGS. 13A and 13C are diagrams illustrating a metallic region, a non-metallic region, and a segmented portion, according to an embodiment.

FIG. 13A illustrates a structure in which an overall external conductor including the external conductor 203 to which the conductive connecting member 500 according to an embodiment is connected is not segmented.

According to an embodiment, FIG. 13B illustrates a structure in which a portion of the external conductor 203, to which the conductive connecting member 500 is connected, operates or functions as the antenna and is not segmented. FIG. 13B also illustrates a structure in which a gap portion is present in one position of the external conductor that does not function as the antenna, according to an embodiment.

According to an embodiment, FIG. 13C illustrates a structure in which a portion of the external conductor 203, to which the conductive connecting member 500 is connected, operates or functions as the antenna and is not segmented. FIG. 13C also illustrates a structure in which gap portions are present in two locations on the external conductor, which does not function as the antenna.

Referring to FIGS. 13A through 13C, the non-metallic region may be present, regardless of the conductive connecting member 500. In an embodiment in which the external conductor is positioned around the additionally present non-metallic region and does not function as the antenna, the gap portion may be included. In an embodiment, the gap may be excluded from the external conductor connected to the conductive connecting member to function as the antenna, of the overall external conductor.

The external conductor that does not function as the antenna, according to an embodiment, is irrelevant to the presence of the gap. However, according to an embodiment, because the external conductor is used to perform an antenna function when the gap is excluded from the external conductor, an overall non-segmented external conductor may be used. Thus, in the case in which the overall non-segmented external conductor is used, a plurality of advantages on aesthetics and manufacturing may be provided.

In addition, in FIGS. 4 through 11 and 13 described above, the first impedance matching unit IM1, which is disposed between the circuit unit 150 and the conductive connecting member 500 in some embodiments, is omitted. However, the first impedance matching unit IM1 is disposed on a portion of the electronic device 10 at which the circuit unit 150 and the conductive connecting member 500 are electrically connected to each other, as illustrated in FIGS. 2 and 3.

Also, the conductive connecting member 500 and the external conductor 203, the conductive connecting member 500 and the ground of the substrate 100, the ground pattern 400 and the ground of the substrate 100, and the ground pattern 400 and the external conductor 203, respectively, are directly electrically connected to each other, or may also be connected to each other by an additional impedance matching unit.

In this case, the impedance matching unit including the first impedance matching unit IM1 may include a passive element, such as at least one of a capacitor, an inductor, and a resistor. In a case in which the capacitor is used for the first impedance matching unit IM1, antenna efficiency is improved.

Figure 14C:
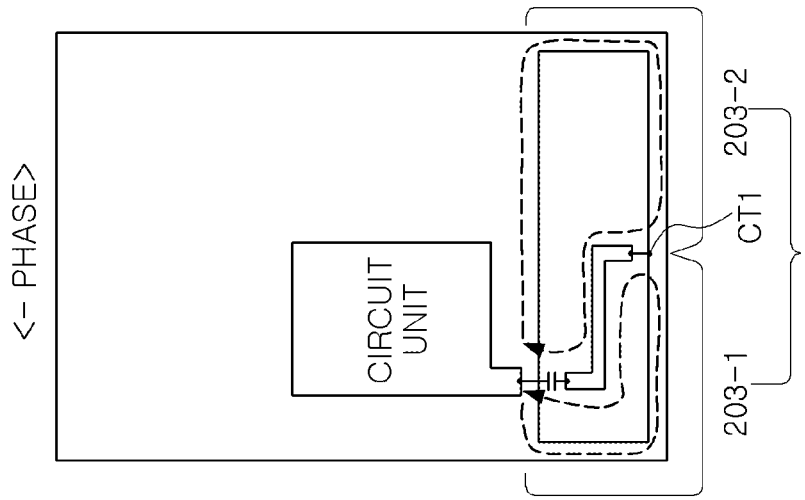
FIGS. 14A through 14C are diagrams illustrating a flow of current, according to an embodiment.
Figure 14B:
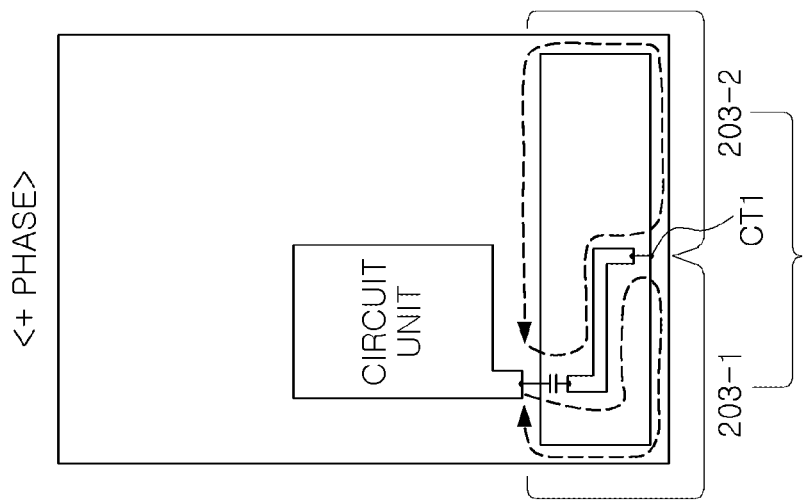
Figure 14A:
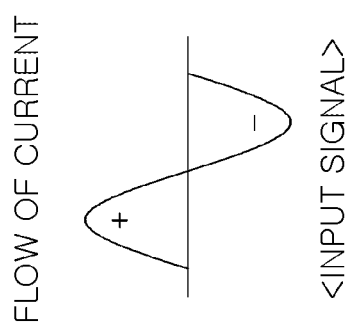

FIGS. 14A and 14C are diagrams illustrating a flow of current, according to an embodiment.

FIG. 14A illustrates a sinusoidal wave signal as an example of an input signal to illustrate a flow of current.

FIG. 14B illustrates a current path for a positive (+) phase of the input signal. FIG. 14C illustrates a current path for a negative (−) phase of the input signal.

As an example, referring to FIGS. 14A and 14B, a current of the positive (+) phase passes through the circuit unit, the feed line, the first impedance matching unit, the conductive connecting member, and the first connecting terminal (CT1) of the external conductor 203. The current of the positive (+) phase may branch in a horizontal direction of FIGS. 14A and 14B, may pass through each of the first external radiation conductor 203-1 and the second external radiation conductor 203-2 of the external conductor 203, and may then flow into the ground of the substrate.

Further, referring to FIG. 14C, a current of the negative (−) phase may flow opposite from the current of the positive (+) phase. That is, the current of the negative (−) phase passes through the first connecting terminal (CT1) of the external conductor 203, the conductive connecting member, the first impedance matching unit, the feed line, and the circuit unit. The current of the negative (−) phase passes through each of the first external radiation conductor 203-1 and the second external radiation conductor 203-2 of the external conductor 203, and flows away from the ground of the substrate.

A first current flow (a current flow to a left) PH1 of the current of the positive (+) phase, according to an embodiment, flows to the ground of the substrate by sequentially passing through the circuit unit, the feed line, the first impedance matching unit, the conductive connecting member, the first connecting terminal CT1 of the external conductor 203, and the first external radiation conductor 203-1 of the external conductor 203.

Further, a second current flow (a current flow to a right) PH2 of the current of the positive (+) phase flows to the ground of the substrate by sequentially passing through the circuit unit, the feed line, the first impedance matching unit, the conductive connecting member, the first connecting terminal CT1 of the external conductor 203, and the second external radiation conductor 203-2 of the external conductor 203.

Further, as illustrated in FIG. 14C, the current of the negative (−) phase flows in an opposite direction to the current of the positive (+) phase described above.

Also, each of the first external radiation conductor 203-1 and the second external radiation conductor 203-2 is formed without the gap, and the first external radiation conductor 203-1 and the second external radiation conductor 203-2 are integrally formed, without the gap therebetween. As described above, the gap refers to a section in which the conductive material is discontinuous, which may be formed of a non-metal material such as air or plastic, by way of example.

Further, each of the first external radiation conductor 203-1 and the second external radiation conductor 203-2 operate as the main radiator of the antenna to form distinct resonance bands. In an example, as long as the resonance bands are distinct from each other, the resonance bands need not to be limited to specific frequencies. As an example, the resonance bands may be a low frequency band lower than 1 GHz and a high frequency band higher than 1 GHz.

In a case in which the conductive connecting member 500 disposed on the substrate 100 is not integrally formed with the conductor frame 200, the conductive connecting member 500 is electrically connected to the external conductor 203 through another electrical connection structure. An example thereof will be described with reference to FIGS. 15A through 15C.

Figure 15A:
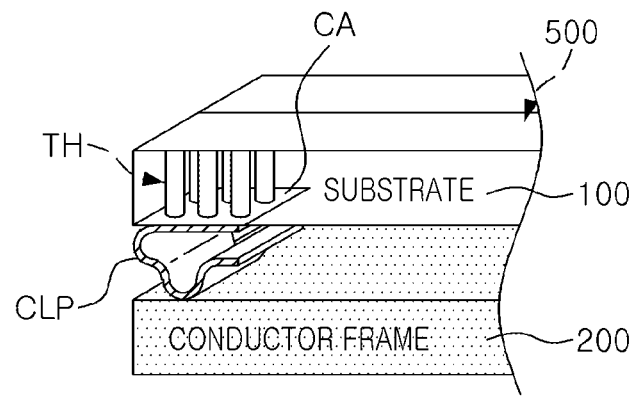
FIGS. 15A through 15C are diagrams illustrating a connecting structure between a conductive connecting member of a substrate and the conductor frame, according to an embodiment.
Figure 15B:
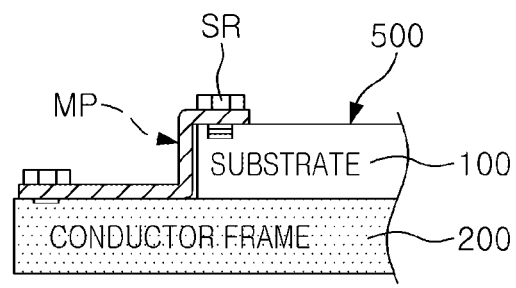
Figure 15C:
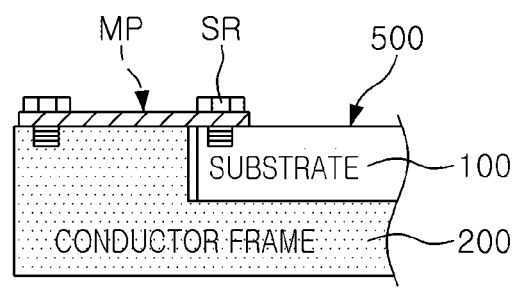

FIGS. 15A through 15C are diagrams illustrating a connecting structure between the conductive connecting member of the substrate and the conductor frame, according to an embodiment.

Referring to FIG. 15A, the conductive connecting member 500 disposed on the non-metallic region A2 (FIGS. 4A and 4B) of the substrate 100 and the connecting structure of the conductor frame 200 include via holes TH, a contact area CA, and a clip CLP.

The via holes, which are conductive holes penetrating through upper and lower surface of the substrate 100, are electrically connected to the conductive connecting member 500 formed on the non-metallic region A2 (FIGS. 4A and 4B) of the substrate 100 and are electrically connected to the conductive contact area CA formed on the other surface of the substrate 100 to electrically connect the conductive connecting member 500 and the conductive contact area CA to each other.

The conductive contact area CA is electrically connected to the conductor frame 200 through the conductive clip CLP.

FIG. 15B is a diagram illustrating an embodiment in which the conductive connecting member 500 and the conductor frame 200 have different surface heights for an electrical connection. FIG. 15C is a diagram illustrating an embodiment in which the conductive connecting member 500 and the conductor frame 200 have the surface heights for the electrical connection that are the same as or similar to each other.

Referring to FIGS. 15B and 15C, the conductive connecting member 500 of the substrate 100 and the connecting structure of the conductor frame 200 includes a screw SR and a conductive plate MP. The conductive connecting member 500 formed on the non-metallic region A2 (FIGS. 4A and 4B) of the substrate 100 and the conductor frame 200 is electrically connected to the substrate 100 using the screw SR and the conductive plate MP regardless of the surface height for the electrical connection. Although a screw SR is used to operatively connect the substrate 100 to the conductive plate MP, a person of skill in the art will appreciate that other mechanisms may be used to secure or attach the substrate to the conductive plate MP.

The description with reference to FIGS. 15A through 15C is only one example among several connecting structures for electrically connecting the conductive connecting member 500 and the conductor frame 200 to each other.

Figure 16:
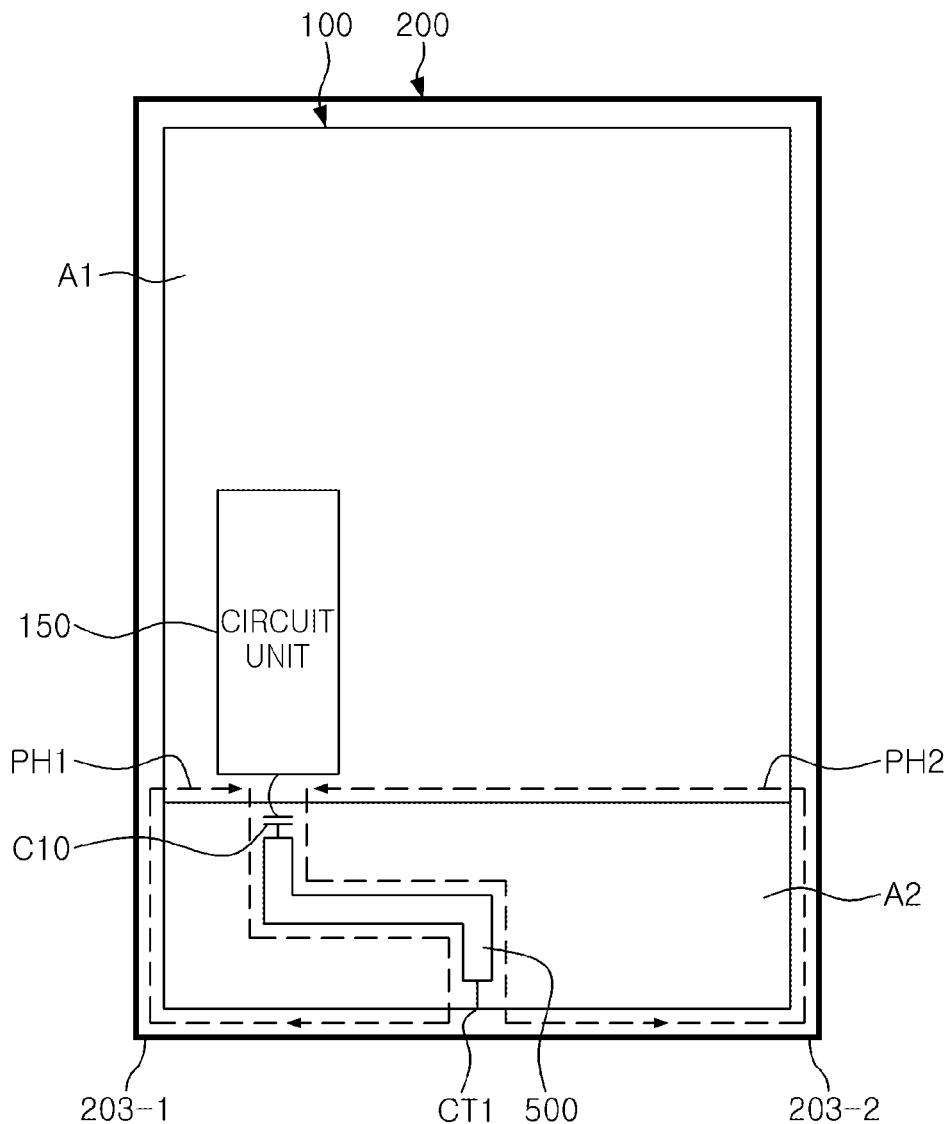
FIG. 16 is a diagram illustrating a configuration and an operation of the multiband antenna, according to an embodiment.

FIG. 16 is a diagram illustrating a configuration and operations of the multiband antenna, according to an embodiment.

Referring to FIG. 16, the conductive connecting member 500 is disposed on a region of the electronic device, without overlapping with a display region of the display panel 300 (FIGS. 5A and 5B), as illustrated in FIG. 16. In an embodiment, the non-metallic region 202 of the conductor frame 200 is the empty space, such as air, from which a portion of the metal is removed, or is formed of a non-metallic material such as plastic, another solid dielectric material, or polyurethane material, as described above.

As an example, as long as the non-metallic region 202 provides a radiation space through the conductive connecting member 500, a shape and size of the non-metallic region 202 is not particularly limited. As an example, the shape of the non-metallic region 202 may be a quadrangular shape or a curved shape. The number of non-metallic regions may be at least one and may also be formed of a plurality of straight line segments.

The various embodiments described above merely illustrate the respective examples of the non-metallic region 202, and are not limited thereto.

Referring to FIG. 16, the conductive connecting member 500 is connected to the circuit unit 150 of the substrate 100 through a capacitor C10 corresponding to an example of the first impedance matching unit IM1. The conductive connecting member 500 is electrically connected to the connecting terminal CT1 of the external conductor 203 of the conductor frame 200 through a connecting structure, as illustrated in FIG. 15.

The circuit unit 150 of the substrate 100 is electrically connected to the external conductor 203 of the conductor frame 200 through the capacitor C10 and the conductive connecting member 500. In addition, the metallic region A1 of the substrate 100 is electrically connected to the metallic region 201 (FIGS. 4A and 4B) of the conductor frame 200. In an example, as long as the metallic region A1 of the substrate 100 and the metallic region 201 of the conductor frame 200 are electrically connected to each other, a mechanism to electrically connect the metallic region A1 of the substrate 100 and the metallic region 201 of the conductor frame 200 is not particularly limited. This will be described with reference to FIGS. 28 through 34.

For example, referring to FIGS. 14 through 16, a current output from the circuit unit 150 of the substrate 100 forms the first current path PH1 flowing into the ground of the substrate 100 through the feed line, the first impedance matching unit IM1, the conductive connecting member 500, and the first external radiation conductor 203-1. Further, the current output from the circuit unit 150 of the substrate 100 forms the second current path PH2 flowing into the ground of the substrate through the feed line, the first impedance matching unit IM1, the conductive connecting member 500, and the second external radiation conductor 203-2.

In an embodiment, the first current path PH1 is a current path for a high frequency band, and the second current path PH2 is a current path for a low frequency band.

In this case, a position in which the conductive connecting member 500 is electrically connected to the external conductor 203 changes depending on the frequency band used to select a resonance frequency.

The conductive connecting member 500 described above may be directly electrically connected to the external conductor 203, the metallic region A1 of the substrate 100, or the metallic region 201 of the conductor frame 200 or may be connected thereto through an impedance device. In this case, a covered band of the antenna changes depending on an impedance value of the impedance device.

Figure 17:
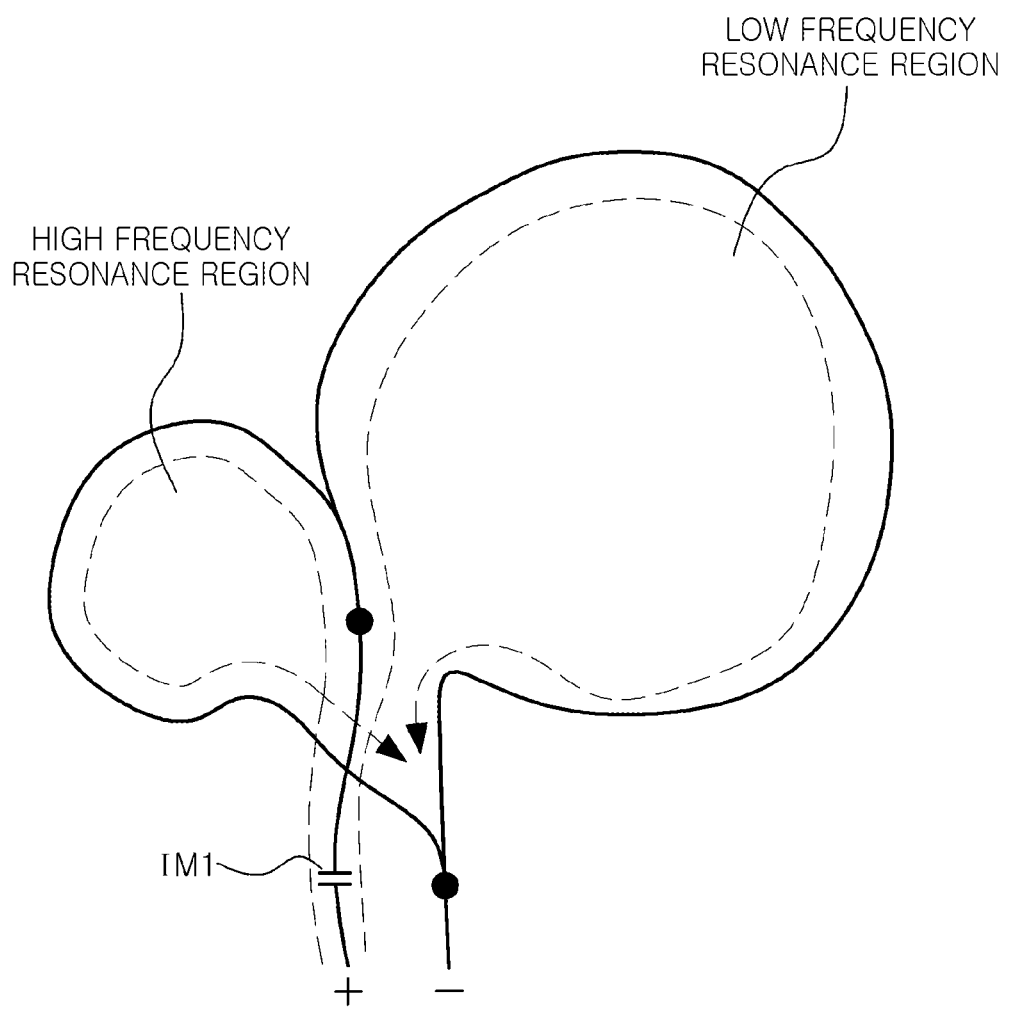
FIG. 17 is a diagram illustrating the operation and a resonance region of the multiband antenna of FIG. 16.

FIG. 17 is a diagram illustrating operations and a resonance region of the multiband antenna of FIG. 16.

FIG. 17 is a diagram illustrating an operation and a resonance region of a series feed type coupling antenna applied to FIG. 16.

As illustrated in FIG. 17, in a case in which a capacitance coupling is formed by using a capacitor as the first impedance matching unit IM1, the multiband antenna is operated as a series feed type coupling antenna. In this case, a conductive path of a loop shape as illustrated in FIG. 17 is formed by the capacitance coupling.

In an example, the first impedance matching unit IM1 connected to a feed line (+) of the circuit unit may also be implemented using the capacitor. Alternatively, the first impedance matching unit IM1 may be implemented using a discrete element such as an inductor or a resistor, instead of the capacitor, as needed.

Alternatively, the first impedance matching unit IM1 includes a passive device including, but not limited to, at least one of a capacitor, an inductor, and the resistor, or may be formed as a combination thereof.

In FIGS. 16 and 17, a direction of current flow is indicated as a flow in the positive (+) phase. In FIGS. 16 and 17, in an electrical length corresponding to a length of current flow, a low frequency resonance fL is formed in a right portion having a long electrical length and a high frequency resonance fH is formed in a left portion having a short electrical length.

The inductor is used in the first impedance matching unit connected to the feed line, instead of the capacitor. In this embodiment, an antenna of a loop shape may not be formed by the coupling antenna to form a different resonance from that of the coupling antenna.

Figure 18:
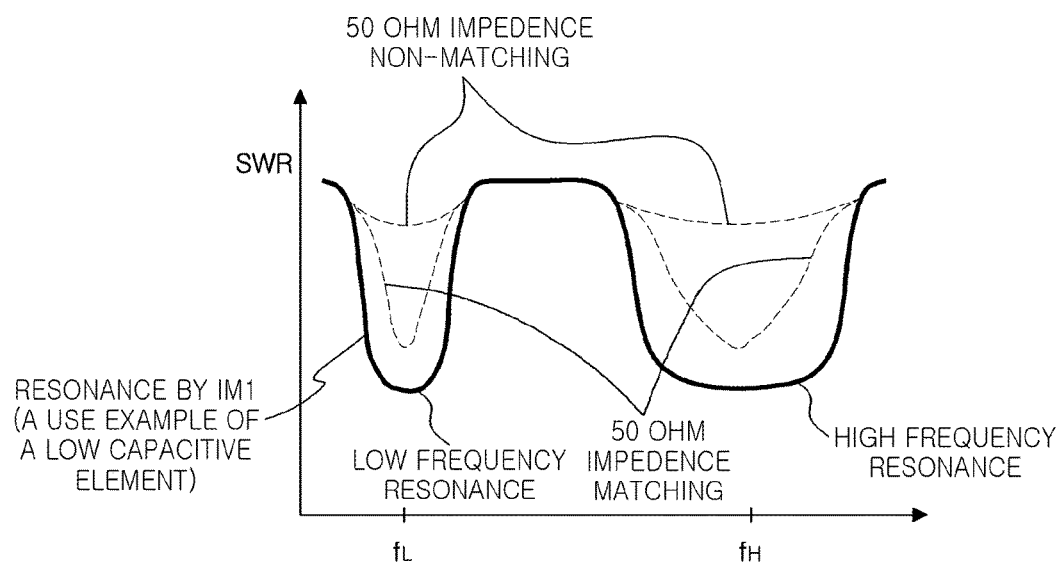
FIG. 18 is a frequency characteristics view for a first impedance matching unit of the multiband antenna of FIG. 16.

FIG. 18 is a frequency characteristics view for a first impedance matching unit of the multiband antenna of FIG. 16.

FIG. 18 illustrates a plot of a frequency to a standing-wave-ratio (SWR) representing an influence by the first impedance matching unit IM1 of the multiband antenna of FIGS. 16 and 17.

Referring to FIG. 18, the first impedance matching unit IM1 (FIG. 2) illustrates a frequency characteristics view of an example in which a low capacitive element is used. In this example, the first impedance matching unit is an impedance device formed of at least one of an element, a pattern, an electrode, a circuit, and a metal member that may provide impedance. The impedance device is not limited to a specific structural component.

Referring to FIG. 18, depending on the length of the loop of current flow, a low frequency resonance having a long electrical loop length and a high frequency resonance having a short electrical loop length are formed. Further, a 50 ohm impedance matching is implemented by using an antenna resonance depending on a coupling amount of the first impedance matching unit IM1. In this case, as illustrated in FIG. 18, better low frequency resonance characteristics is obtained.

Furthermore, the conductive connecting member 500 and the external conductor 203, the conductive connecting member 500 and the ground of the substrate 100, the ground pattern 400 and the ground of the substrate 100, and the ground pattern 400 and the external conductor 203, respectively, are electrically and directly connected to each other, may also be connected to each other through an additional impedance matching unit, or may be operatively connected to each other through other active or passive devices. This will be described with reference to FIGS. 19 and 20D.

Figure 19:
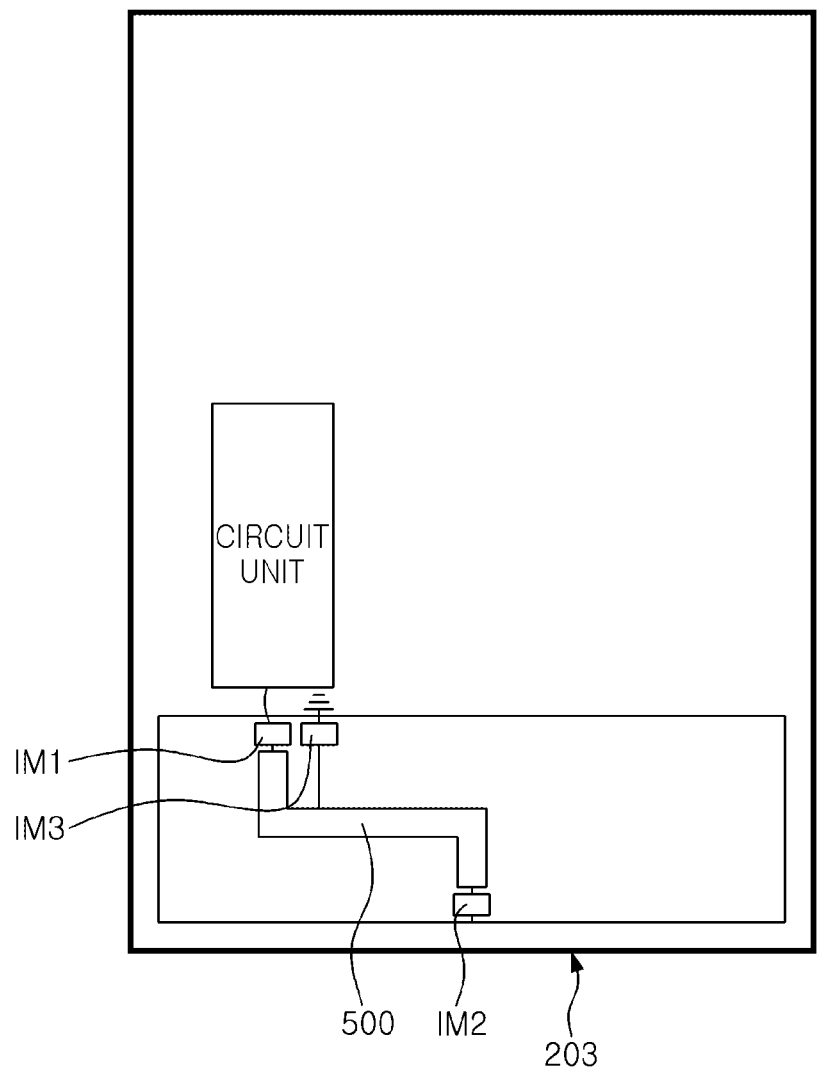
FIG. 19 is a diagram illustrating a configuration and an operation of the multiband antenna according to an embodiment.

FIG. 19 is a diagram illustrating a configuration and an operation of the multiband antenna according to an embodiment.

Referring to FIG. 19, the multiband antenna, according to an embodiment, further includes at least one impedance matching unit of the first impedance matching unit IM1, a second impedance matching unit IM2, and a third impedance matching unit IM3.

The first impedance matching unit IM1 is included in the feed line between the circuit unit and the conductive connecting member 500. The second impedance matching unit IM2 is included between the conductive connecting member 500 and the external conductor 203. In addition, the third impedance matching unit IM3 is included between a point between both ends of the conductive connecting member 500 and the ground of the substrate 100.

In an embodiment, although FIG. 19 illustrates an example including all of the first impedance matching unit IM1, the second impedance matching unit IM2, and the third impedance matching unit IM3, this is merely one example and the embodiment is not limited thereto. In accordance with an alternative embodiment, one of the second impedance matching unit IM2 and the third impedance matching unit IM3 are included in the embodiment. Furthermore, in a further alternative embodiment, additional impedance matching units may be included in addition to the second impedance matching unit IM2 and the third impedance matching unit IM3.

Further, at least one of the first impedance matching unit IM1, the second impedance matching unit IM2, and the third impedance matching unit IM3 are a fixed impedance matching unit fixed to have preset impedance or a variable impedance matching unit that has a variable impedance.

For example, the fixed impedance matching unit is implemented by at least one impedance element that provides predetermined impedance. As an example, the impedance element is a passive element such as a capacitor, an inductor, and a resistor.

As an example, the variable impedance matching unit includes a variable impedance element such as a varactor diode, includes a variable impedance circuit that varies the impedance using a switch element, and includes all of the variable impedance element and the variable impedance circuit.

In a case in which the fixed impedance matching unit or the variable impedance matching unit includes at least two passive or active elements, the at least two elements are formed as a combination of various series/parallel circuits.

Further, in a case in which each of the first impedance matching unit IM1, the second impedance matching unit IM2, and the third impedance matching unit IM3 includes a fixed element, a variable element may be further included. In this case, the impedance may also be varied.

As such, the cover band of the antenna may be variously changed by varying the impedance of at least one of the first, second, and third impedance matching units IM1, IM2, and IM3. As a result, an LTE full band may be covered by the multiband antenna according to an embodiment.

FIGS. 20A through 20D are diagrams illustrating the first impedance matching unit (IM1), according to an embodiment.

Figure 20A:
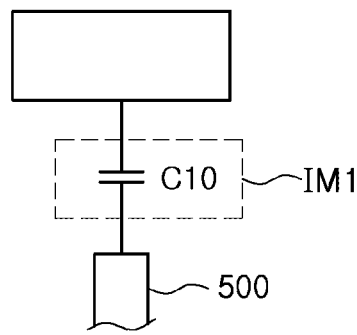
FIGS. 20A through 20D are diagrams illustrating a first impedance matching unit (IM1), according to an embodiment.

FIG. 20A illustrates an example in which the first impedance matching unit IM1 is implemented using the fixed impedance matching unit including a fixed capacitor C10.

Figure 20B:
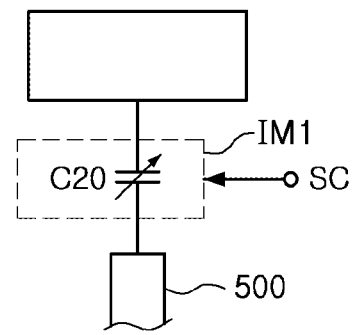

FIG. 20B illustrates an example in which the first impedance matching unit IM1 is implemented using the variable impedance matching unit including a variable coupling element or a circuit C20. In this case, capacitance of the first impedance matching unit IM1 is varied depending on a control voltage SC.

Figure 20C:
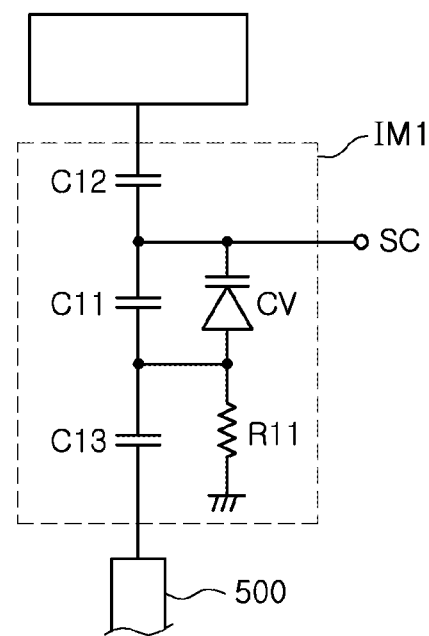

FIG. 20C illustrates an example in which the first impedance matching unit IM1 is implemented using the variable impedance matching unit including a fixed capacitor C11 and a varactor diode CV, parallel to the fixed capacitor C11. In this case, C12 and C13 are DC blocking capacitors, SC is a control voltage SC to control capacity of the varactor diode CV, R11 is resistance providing a ground path of the control voltage SC.

Figure 20D:
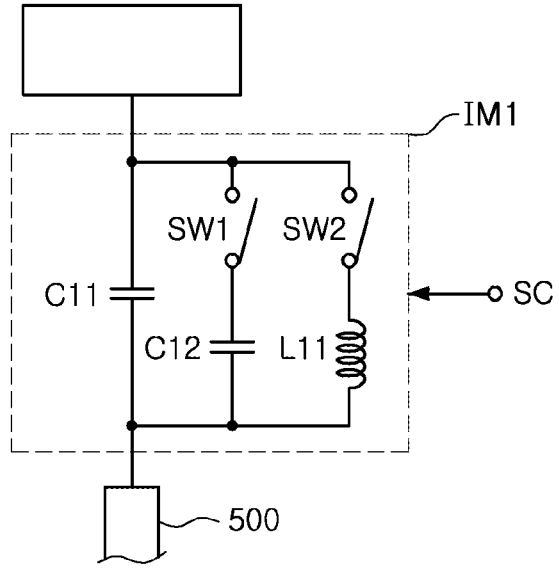

FIG. 20D illustrates an example in which the first impedance matching unit IM1 is implemented by the variable impedance matching unit including the fixed capacitor C11 and a switched impedance circuit, parallel to the fixed capacitor C11. In an embodiment, the switched impedance circuit includes a switch SW1 and the capacitor C12, which are connected to each other in series and/or includes a switch SW2 and an inductor L11, connected to each other in series.

As such, FIGS. 20A through 20D illustrate various examples in which the first impedance matching unit IM1 is variously implemented by using the fixed impedance element, the variable impedance element, the switch, and the like.

Furthermore, in a case in which the first impedance matching unit IM1 includes the fixed capacitor C11, the fixed capacitor is primarily used to perform the 50 ohm impedance matching using a low capacitive element and improve resonance characteristics as illustrated in FIG. 18 by the 50 ohm impedance matching.

The switched impedance circuit may include a plurality of switches and a plurality of passive elements (an R element, an L element, and a C element).

Although the above-mentioned description describes the first impedance matching unit IM1, this description may be applied to the second and third impedance matching units IM2 and IM3 as is. As such, according to an embodiment, unless specifically otherwise noted, the description for the first impedance matching unit IM1 may be applied to the second and third impedance matching units IM2 and IM3.

Figure 21:
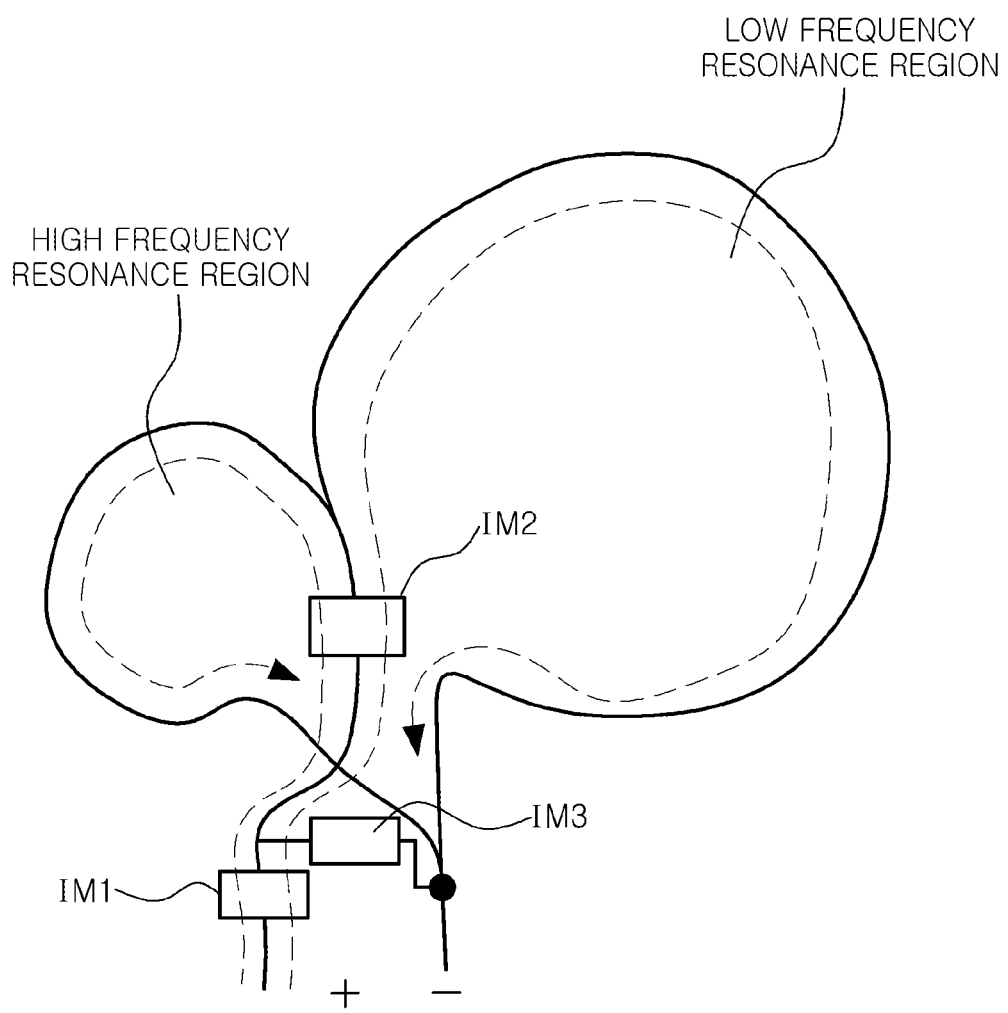
FIG. 21 is a diagram illustrating an operation of the multiband antenna of FIG. 19.
Figure 22:
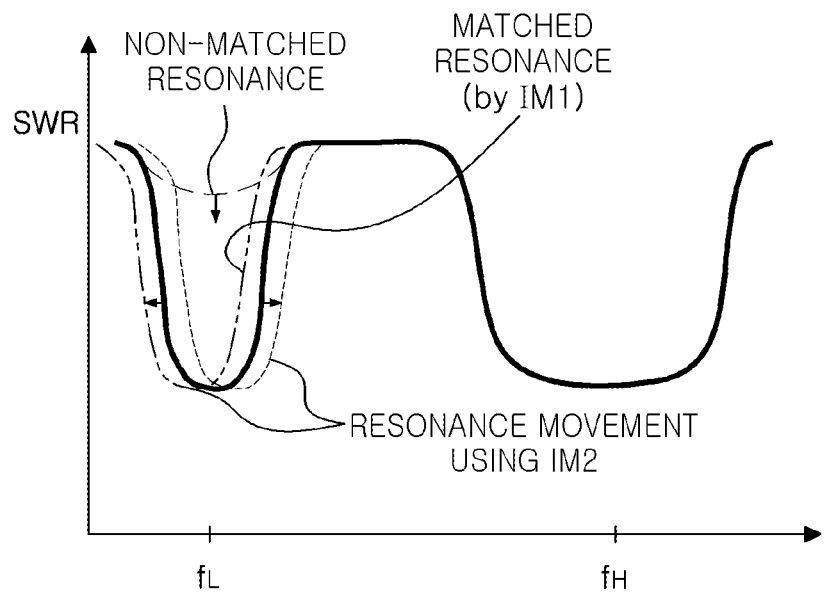
FIG. 22 is a frequency characteristics view by a second impedance matching unit of the multiband antenna of FIG. 19.

FIG. 21 is a diagram illustrating an operation of the multiband antenna of FIG. 19. FIG. 22 is a frequency characteristics view for the second impedance matching unit of the multiband antenna of FIG. 19.

Referring to FIGS. 21 and 22, the first impedance matching unit IM1 of FIG. 21 serves to match an unmatched resonance, as illustrated in FIG. 21.

In a case in which the first impedance matching unit IM1 includes a high capacitive element or includes an inductive element, the multiband antenna operates as a planar inverted-F antenna (PIFA) or a loop antenna.

In addition, referring to FIGS. 21 and 22, the first impedance matching unit IM1 matches the unmatched resonance, but it is difficult for the first impedance matching unit IM1 to move the resonance.

As illustrated in FIG. 22, when the second impedance matching unit IM2 is used, length characteristics of a loop of current flow are changed. In an embodiment in which the second impedance matching unit IM2 includes an inductive element, a length of the loop increases. In contrast, in an embodiment in which a capacitive element is used, the length of the loop is relatively decreased. Thus, the resonance movement to a low frequency and a high frequency is implemented.

Figure 23:
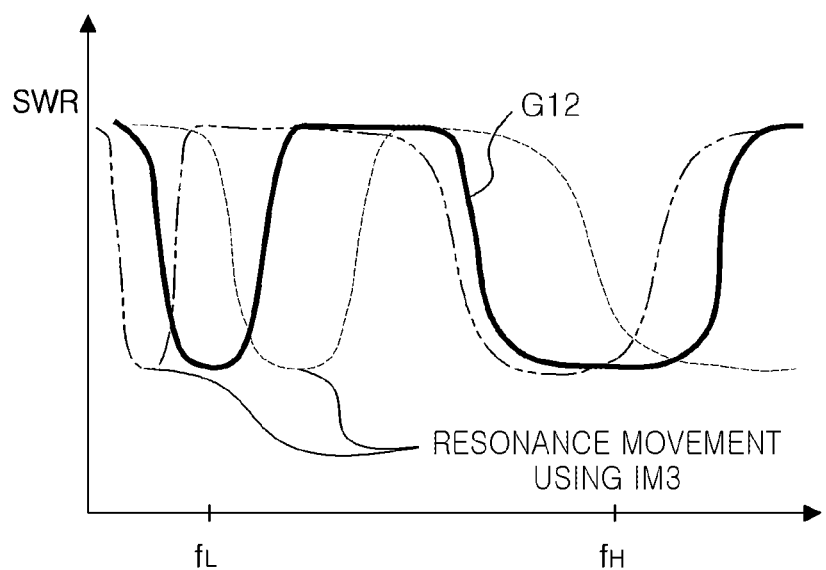
FIG. 23 is a frequency characteristics view for a third impedance matching unit (IM3) of the multiband antenna of FIG. 19.

FIG. 23 is a frequency characteristics view for the third impedance matching unit (IM3) of the multiband antenna of FIG. 19.

Referring to FIGS. 22 and 23, when the second impedance matching unit IM2 is used, there is a limit to a resonance movement. In order to move the resonance to a lower frequency or a higher frequency, the third impedance matching unit IM3 is used.

Referring to a dot line graph moved to a left and an alternated long and dash line graph moved to a right, based on a graph G12 of FIG. 23, when the third impedance matching unit IM3 is implemented using the capacitive element, the resonance movement to the low frequency is implemented. Further, when the third impedance matching unit IM3 is implemented using the inductive element, movement of the resonance movement to the higher frequency is implemented.

In an example, the resonance movement using the capacitive element and the inductive element may be a change in a general condition and may be changed depending on several peripheral conditions.

Figure 24:
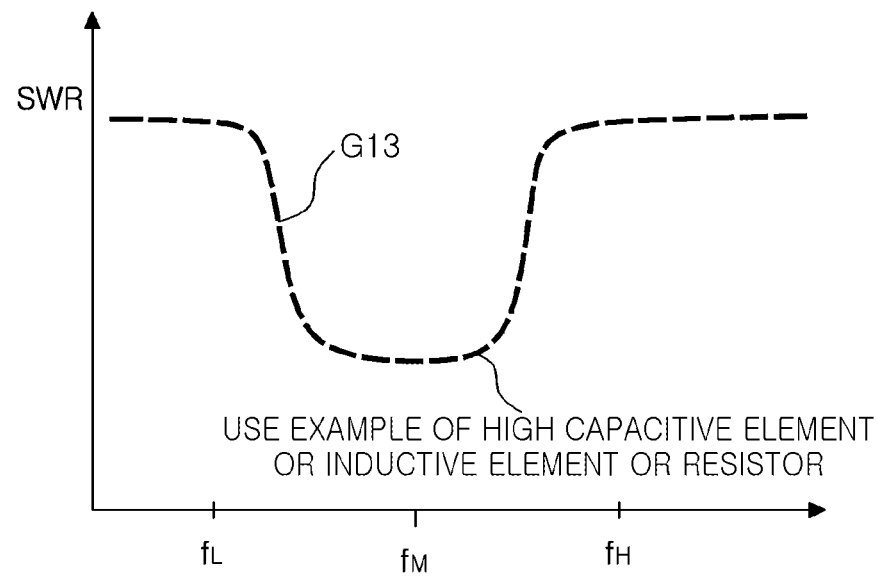
FIG. 24 is a frequency characteristics view when the multiband antenna of FIG. 19 is operated as a planar inverted-F antenna (PIFA) or a loop antenna.

FIG. 24 is a frequency characteristics view when the multiband antenna of FIG. 19 is operated as the PIFA or as a loop antenna.

As an example, FIG. 24 is a frequency characteristics view of the antenna for an embodiment in which the first impedance matching unit IM1 does not include the low capacitive element and includes the high capacitive element or resistor and an inductive element.

Referring to FIG. 24, as an example, in an embodiment in which the antenna does not form the capacitance coupling, the antenna is operated as the PIFA or the loop antenna. Standing-wave-ratio characteristics are exhibited as in a graph G13 illustrated in FIG. 24, which may also be antenna characteristics in a general condition and may be changed depending on the condition.

Figure 25:
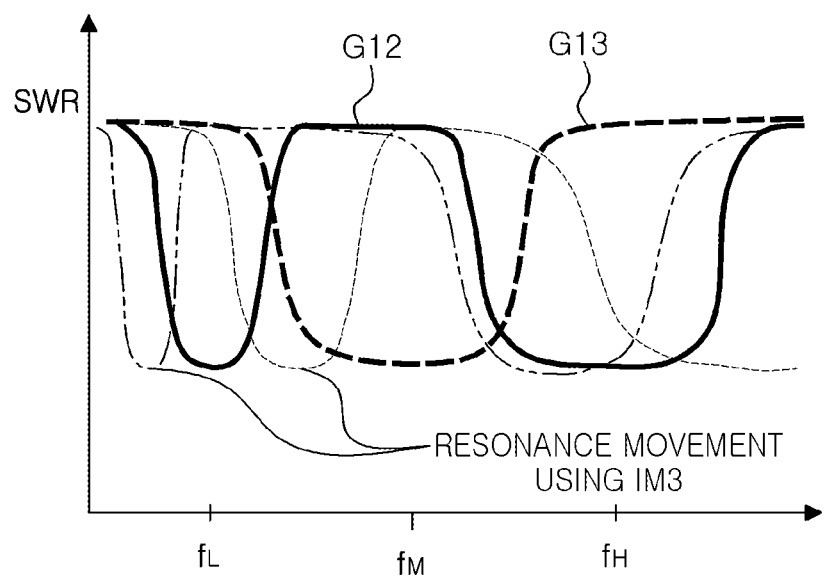
FIG. 25 is a frequency characteristics view for an overall long term evolution (LTE) band by the multiband antenna, according to an embodiment.

FIG. 25 is a frequency characteristics view for an overall long term evolution (LTE) band by the multiband antenna, according to an embodiment.

The graph G12 of FIG. 23 and the graph G13 of FIG. 24 are together illustrated in FIG. 25. Referring to FIG. 25, an LTE full band is covered by using the first, second and third impedance matching units IM1, IM2, and IM3, the conductive connecting member, the external conductor, and the metallic region of the substrate connected to the external conductor, as described above.

For example, 824 to 960 [MHz] (central frequency of fL), 1710 to 2170 [MHz] (central frequency of fM) and 2300 to 2690 [MHz] (central frequency of fH) are satisfied by a combination of the first impedance matching unit IM1. The second impedance matching unit IM2, and 703 to 803 [MHz] are covered by adding the third impedance matching unit IM3. Of course, the LTE band may also be covered by several other combinations.

Figure 26A:
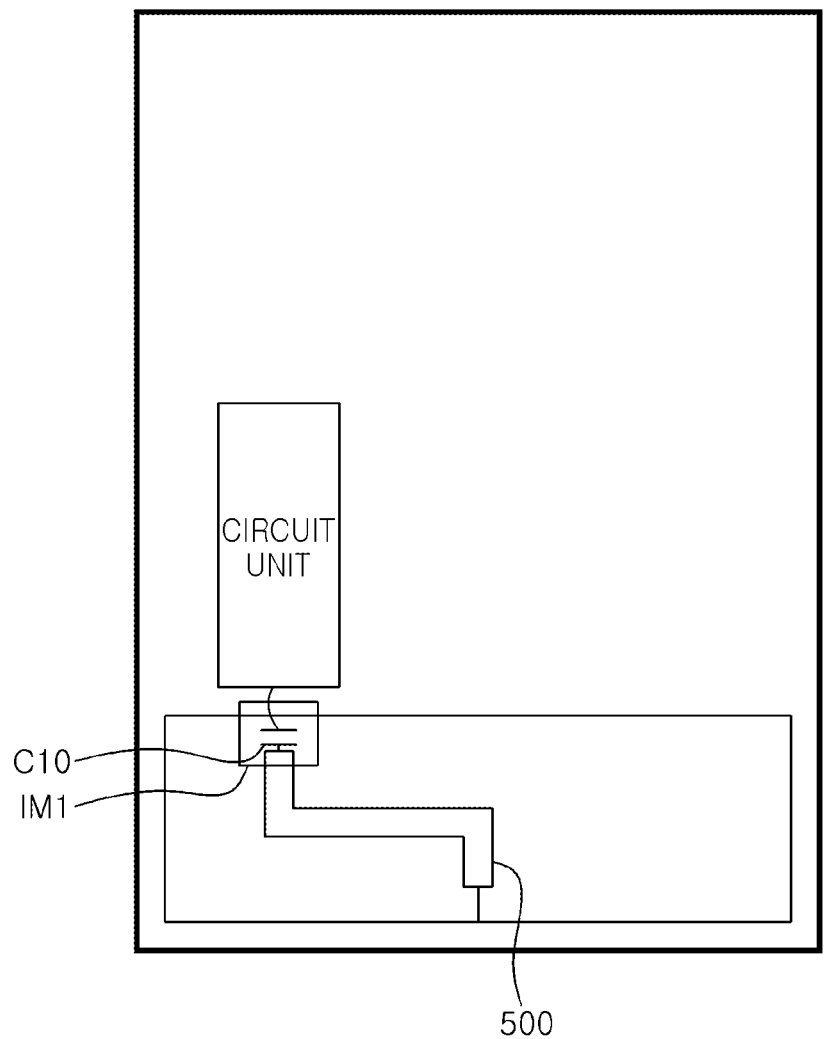
FIGS. 26A through 26C are diagrams illustrating the first impedance matching unit, according to an embodiment.
Figure 26B:
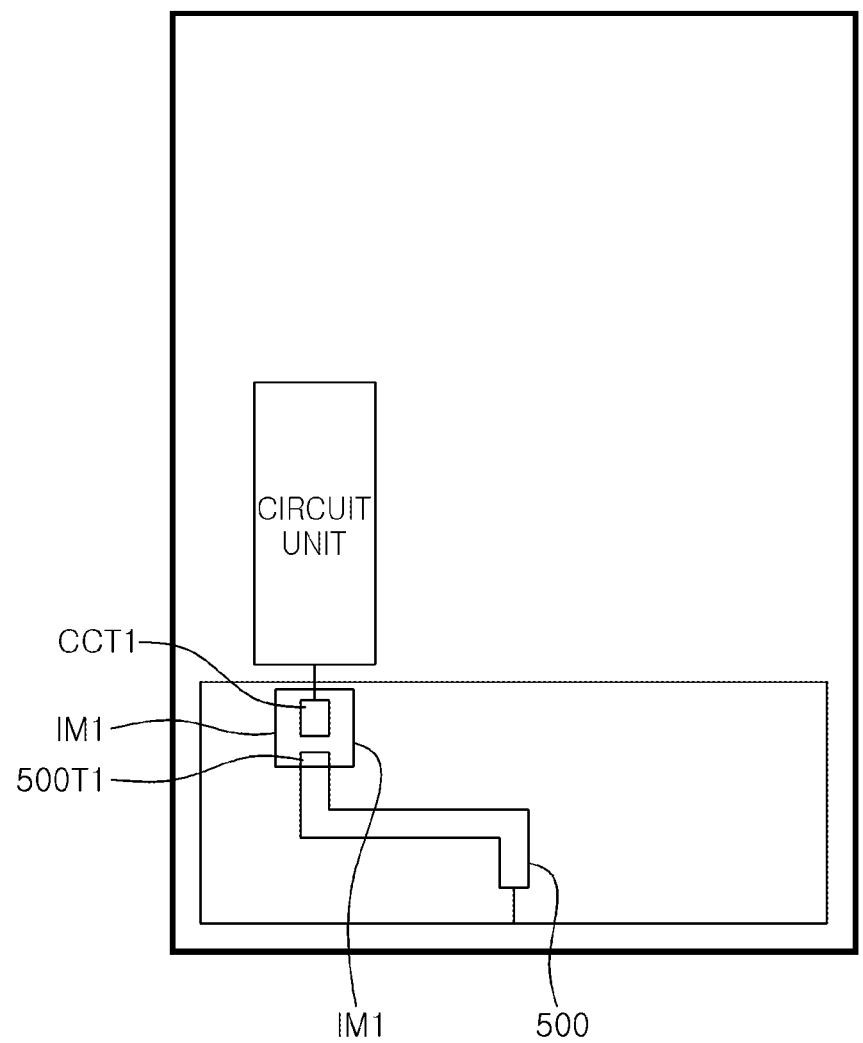
Figure 26C:
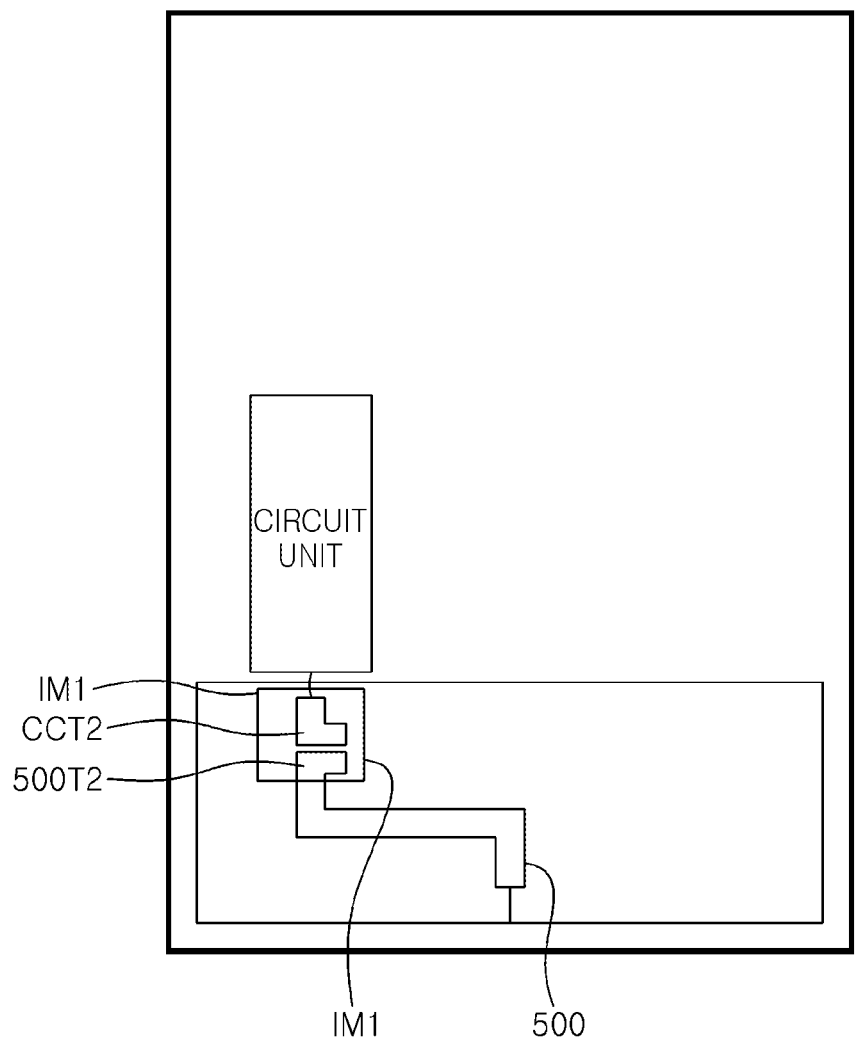

FIGS. 26A through 26C are diagrams illustrating the first impedance matching unit, according to an embodiment.

FIG. 26A illustrates an example in which the first impedance matching unit IM1 includes the fixed capacitor C10. As an example, the fixed capacitor C10 is a capacitor.

In FIG. 26B, the first impedance matching unit IM1 has a fixed capacitance using two conductive members without using the fixed capacitor C10.

Referring to FIG. 26B, a conductive connecting terminal CCT1 is formed to be adjacent to an end portion 500T1 of the conductive connecting member 500. In this embodiment, an example is illustrated in which a capacitance coupling is formed by disposing the end portion 500T1 of the conductive connecting member 500 and the conductive connecting terminal CCT1 to be adjacent to each other.

In the first impedance matching unit IM1 of FIG. 26C, an end portion 500T2 of the conductive connecting member 500 has a larger area than FIG. 26B. A conductive connecting terminal CCT2 forming the capacitance coupling with the end portion 500T2 of the conductive connecting member 500 includes a larger area than the conductive connecting terminal CCT1 illustrated in FIG. 26B.

In this embodiment, an example in which a large capacitance coupling is formed by a coupling of a relatively large area is illustrated.

FIGS. 27A through 27D are frequency characteristics views by the first impedance matching unit, according to an embodiment.

Figure 27A:
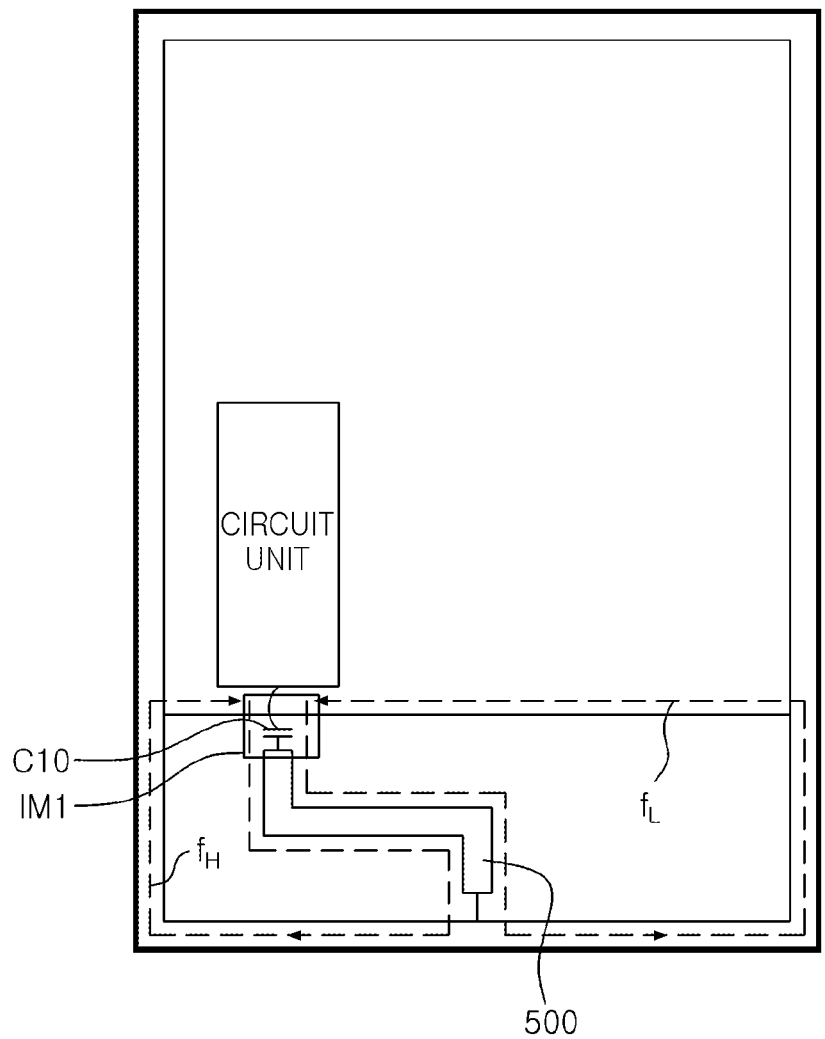
FIGS. 27A through 27D are frequency characteristics views by the first impedance matching unit, according to an embodiment.

FIG. 27A illustrates an example in which the first impedance matching unit IM1 includes the fixed capacitor C10.

Figure 27B:
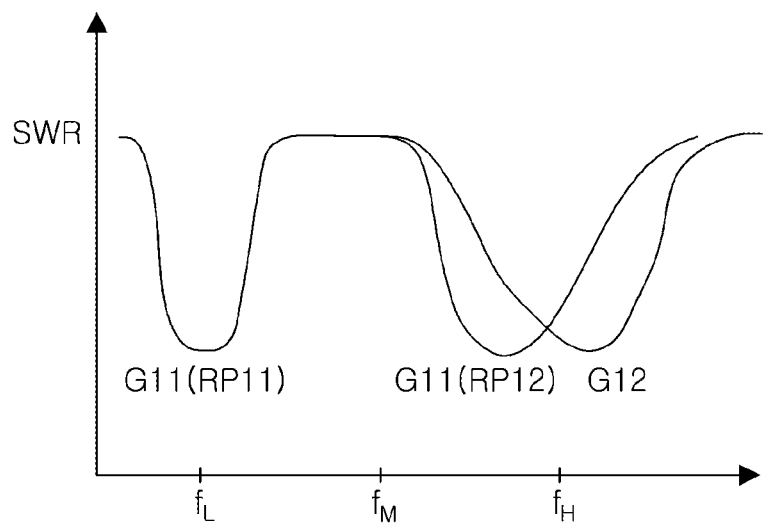

FIG. 27B illustrates graphs exhibiting a resonance band that is formed in a case in which the first impedance matching unit IM1 is implemented by the fixed capacitor C10. In an embodiment in which the first impedance matching unit IM1 is implemented by the fixed capacitor C10, the resonance band has a low frequency resonance such as G11 (RP11) and has a resonance corresponding to a multiplication frequency of a basic resonance frequency, such as G11 (RP12) in a low frequency band (fL) of 1 GHz or less.

At the same time, the resonance band has a high frequency resonance such as G12 in a high frequency band (fH) of 1 GHz or more and has a resonance corresponding to a multiplication frequency (not illustrated) similarly to a basic resonance frequency of G12 or more. In an embodiment, the fixed capacitor C10 has a low capacitive element of 10 pF or less.

Figure 27C:
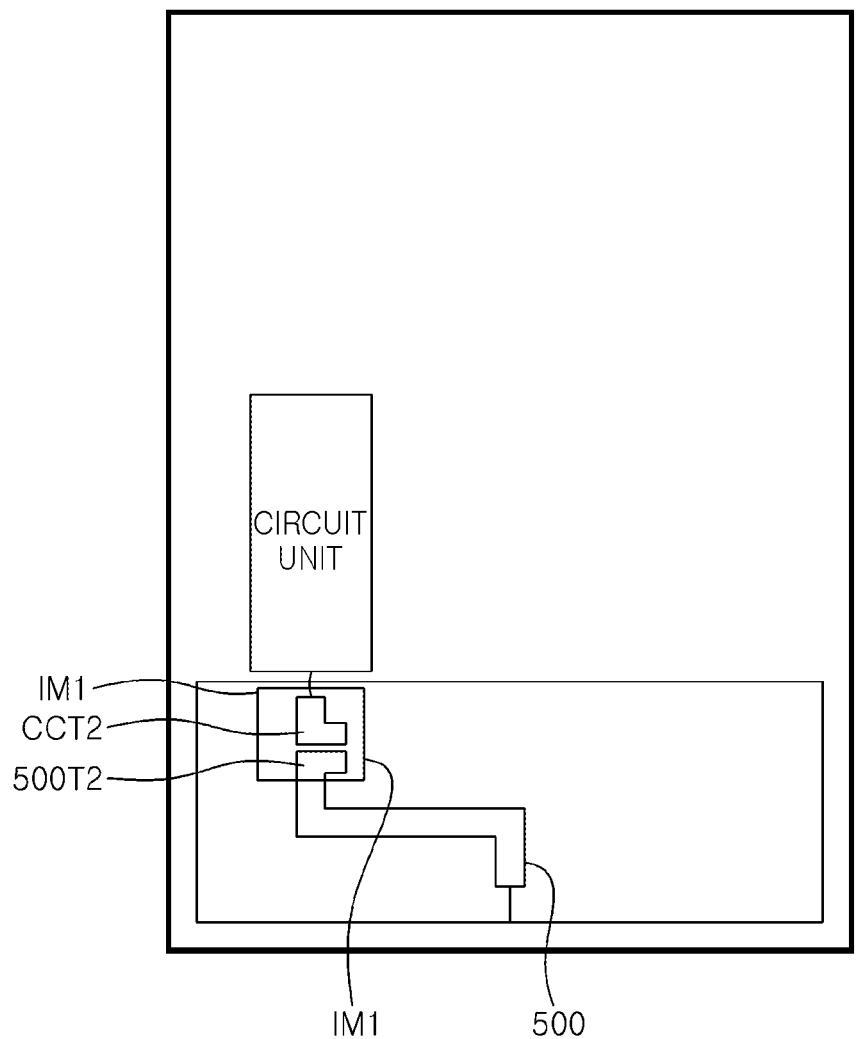

In addition, FIG. 27C illustrates an example in which the first impedance matching unit IM1 includes a fixed inductor L10.

Figure 27D:
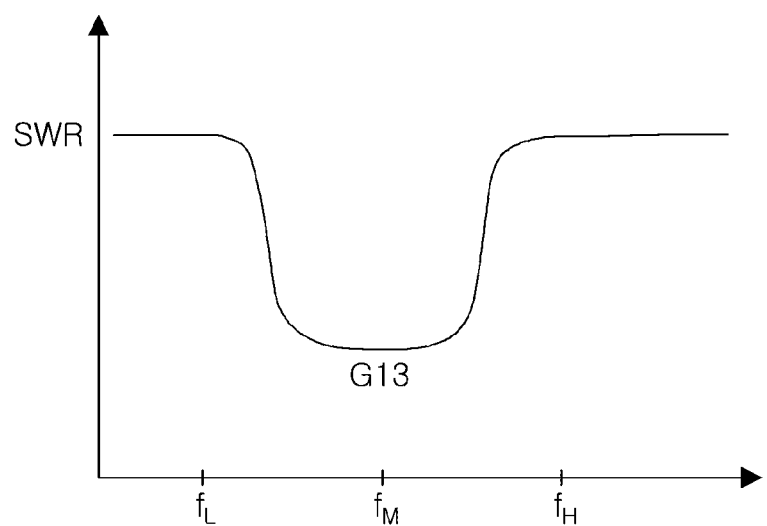

FIG. 27D illustrates a graph illustrating a resonance band that is formed with the first impedance matching unit IM1 being implemented by the fixed inductor L10. When the first impedance matching unit IM1 is implemented by the fixed inductor L10, the resonance band has a middle and high frequency resonance of 1 GHz or more such as G13.

On the other hand, in an embodiment in which the electronic device includes the conductor frame 200 and the substrate, the electronic device includes a plurality of contact conductor lines CM that electrically connect the metallic region 201 of the conductor frame 200 and the metallic region A1 of the substrate 100 to each other. This will be described with reference to FIGS. 28 through 34C.

Figure 28:
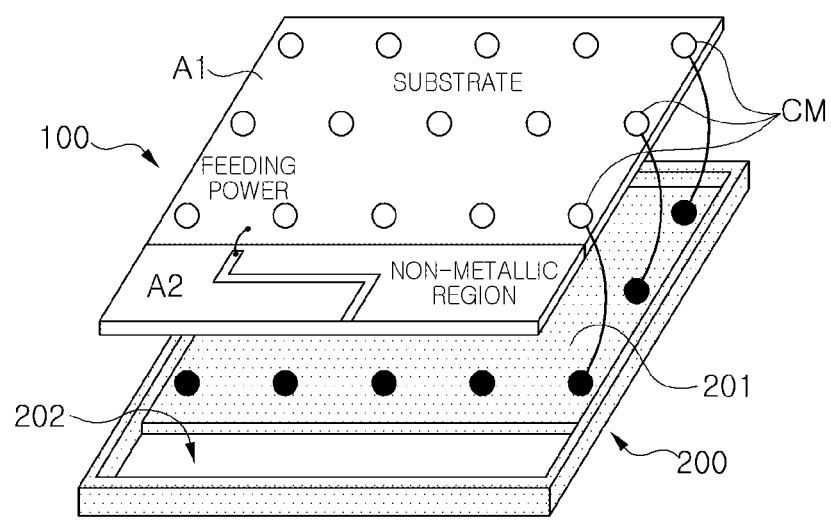
FIG. 28 is a diagram illustrating a dense contact conductor line between the substrate and the conductor frame, according to an embodiment.

FIG. 28 is a diagram illustrating a dense contact conductor line between the substrate and the conductor frame, according to an embodiment.

Referring to FIG. 28, the metallic region A1 of the substrate 100 and the metallic region 201 of the conductor frame 200 are electrically connected to each other through the contact conductor lines CM, which are densely formed. In one example, the contact conductor lines CM is a mechanism or structure to electrically connect together the ground, such as, the metallic region, of the substrate 100 and other conductors, such as, the conductor frame, and/or the external conductor, etc., except for the substrate.

The example illustrated in FIG. 28 is merely an example in which the contact conductor lines CM are uniformly and compactly formed. As the number of densely formed contact conductor lines is increased, the metallic region A1 of the substrate 100 and the metallic region 201 of the conductor frame 200 are electrically connected to each other into a single conductive connecting member.

As an example, the dense formation of the contact conductor lines occurs when an interval between the contact conductor lines is narrower than a waveform length of a used band frequency.

FIGS. 29A through 29C are diagrams illustrating a contact conductor line of arrangement structures of the electronic device, according to an embodiment.

FIG. 29A is a diagram illustrating the contact conductor lines for a structure in which the substrate 100 and the conductor frame 200 are vertically disposed. Referring to FIG. 29A, the metallic region A1 of the substrate 100 and the metallic region 201 of the conductor frame 200 are electrically connected through the plurality of contact conductor lines.

FIG. 29B is a diagram illustrating the contact conductor lines for a structure in which the conductor frame 200A, the metal cover, and the substrate 100 are vertically disposed.

Referring to FIG. 29B, the conductor frame 200A, the conductor cover, formed integrally with the external conductor 203A, and the metallic region A1 of the substrate 100 are electrically connected through the contact conductor lines.

FIG. 29C is a diagram illustrating the contact conductor lines for a structure in which the cover 50, the substrate 100, and the conductor frame 200 are sequentially disposed and have a separate external conductor 203B.

Referring to FIG. 29C, the metallic region A1 of the substrate 100, the conductor frame 200, and the external conductor 203B is electrically connected through the plurality of contact conductor lines.

Referring to FIGS. 29A through 29C, because the contact conductor lines provide the current paths, the resonance changes depending on electrical connection positions between the metallic region A1 of the substrate 100, the metallic region 201 of the conductor frame 200, and external conductor 203, 203A, or 203B.

In addition, the electronic device includes a switching device SWD (FIG. 30) to select a portion of contact conductor lines among the plurality of contact conductor lines between the metallic region, such as, the ground, of the substrate 100 and the conductor frame 200.

As an example, the switching device SWD includes at least one switch to select at least one of the plurality of contact conductor lines between the metallic region A1 of the substrate 100 and the conductor frame 200.

Figure 30:
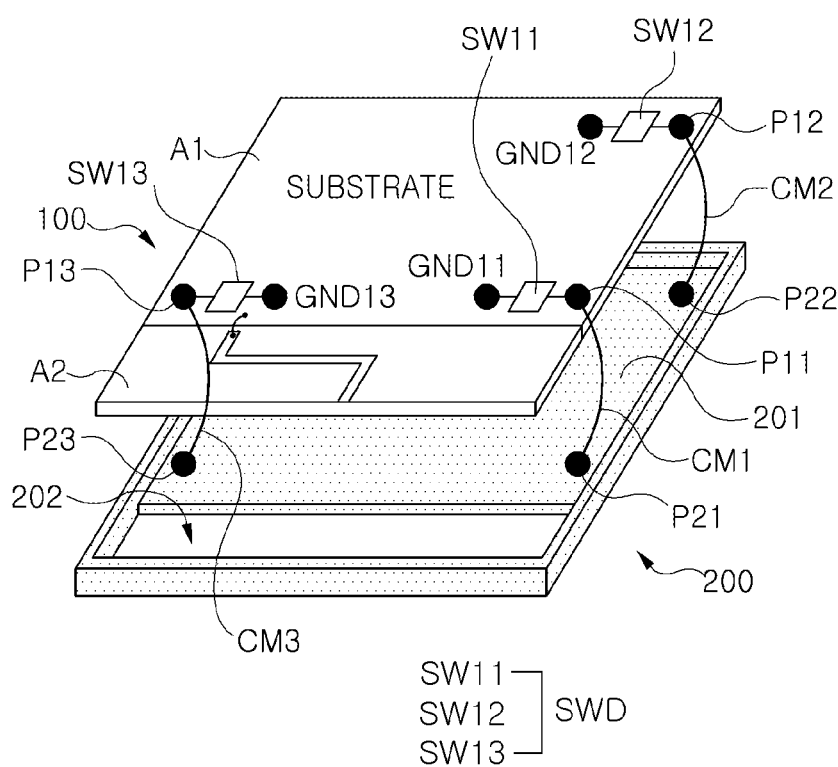
FIG. 30 is a diagram illustrating a switching device (SWD) for selecting the contact conductor line, according to an embodiment.

FIG. 30 is a diagram illustrating a switching device (SWD) for selecting the contact conductor line, according to an embodiment.

Referring to FIG. 30, for example, in a case in which the electronic device includes first, second, and third contact conductor lines CM1, CM2, and CM3 between the metallic region A1 of the substrate 100 and the conductor frame 200, the switching device SWD includes first, second, and third switches SW11, SW12, and SW13 for selecting the first, second, and third contact conductor lines CM1, CM2, and CM3 between the metallic region A1 of the substrate 100 and the conductor frame 200.

In an embodiment, one end of each of the first, second, and third contact conductor lines CM1, CM2, and CM3 are connected to first, second, and third contact points P21, P22, and P23, respectively, of the conductor frame 200. Another end of each of the first, second, and third contact conductor lines CM1, CM2, and CM3 is connected to first, second, and third contact points P11, P12, and P13, respectively, of the substrate 100.

The first switch SW11 is disposed between the first contact point P11 of the substrate 100 and a first ground GND11, the second switch SW12 is disposed between the second contact point P12 of the substrate 100 and a second ground GND12, and the third switch SW13 is disposed between the third contact point P13 of the substrate 100 and a third ground GND13.

As the first, second, and third switches SW11, SW12, and SW13 are turned-on or turned-off, a specific contact conductor line of the first, second, and third contact conductor lines CM1, CM2, and CM3 may be selected.

In an example, as long as the contact conductor line is selected, positions at which the first, second, and third switches SW11, SW12, and SW13 are disposed need not to be particularly limited. For example, the first, second, and third switches SW11, SW12, and SW13 may be disposed on the substrate 100.

As such, the switches of FIG. 30 are applied to all of the contact conductor lines. In another embodiment, the switches may be applied to some or at least one of the contact conductor lines.

As described above, in the electronic device according to an embodiment, the antenna resonance variably changes by varying the impedance using the impedance matching unit or connecting (turning-on) or disconnecting (turning-off) the contact conductor lines by the switches.

The contact conductor lines in FIGS. 28 through 30 are merely illustrative, and the position thereof or the number thereof is not particularly limited.

FIGS. 31A and 31B are diagrams illustrating the contact conductor line, according to an embodiment. FIGS. 31A and 31B are diagrams illustrating a structure of the contact conductor line using a conductor C clip CLP2 and a screw SR2.

Referring to FIG. 31A, the metallic region A1 of the substrate 100 and the metallic region 201 of the conductor frame 200 are electrically connected through the conductor C clip CLP2. In the alternative, the metallic region A1 of the substrate 100 and the metallic region 201 of the conductor frame 200 are electrically and directly connected by the screw SR2. A detailed description thereof will be provided below.

A first figure of FIG. 31B illustrates an example in which the metallic region A1 of the substrate 100 is in contact with a conductive contact area CA2 formed on another surface of the substrate 100 through conductive via holes TH2 formed in the substrate 100. The conductive contact area CA2 is electrically connected to the conductor frame 200 through the conductor C clip CLP2.

A second figure of FIG. 31B illustrates an example in which the substrate 100 and the conductor frame 200 have different surface heights for an electrical connection. A third figure of FIG. 31B illustrates an example in which the metallic region of the substrate 100 and the conductor frame 200 have the surface heights for the electrical connection, which are the same as or similar to each other.

Referring to the second and third figures of FIG. 31B, it is illustrated that the metallic region A1 of the substrate 100 and the conductor frame 200 are electrically connected to each other using the screw SR2 and the conductive plate MP2, regardless of the surface height for the electrical connection.

The description with reference to FIGS. 31A and 31B is only one example among different mechanisms to electrically connect or attach the metallic region A1 of the substrate 100 and the conductor frame 200.

Figure 32A:
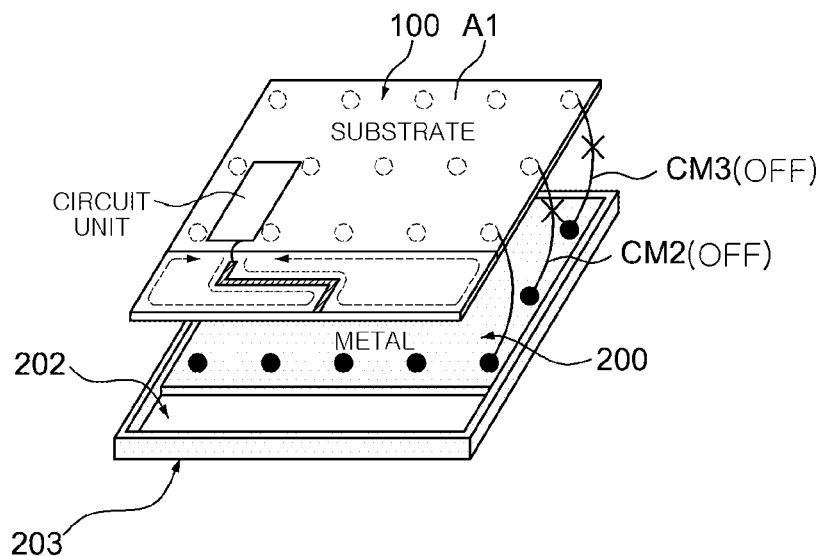
FIGS. 32A and 32B are diagrams illustrating flat and three-dimensional current paths along the dense contact conductor lines, according to an embodiment.
Figure 32B:
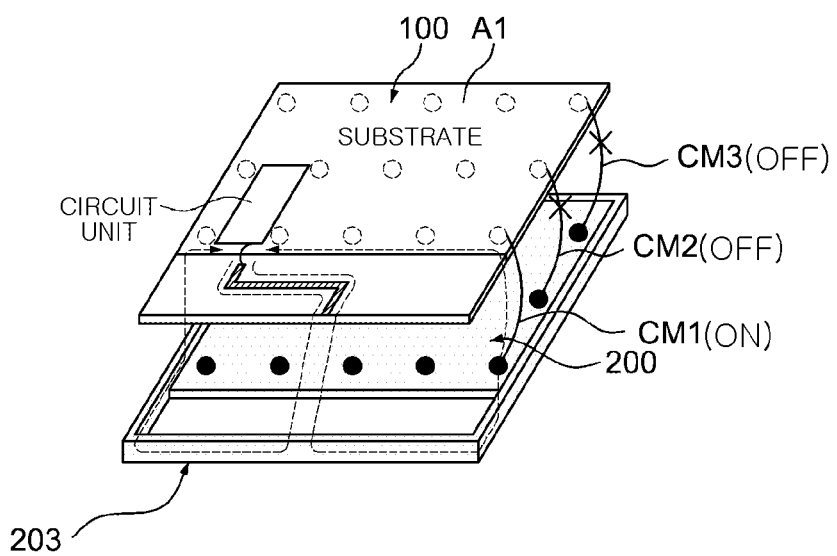
Figure 33A:
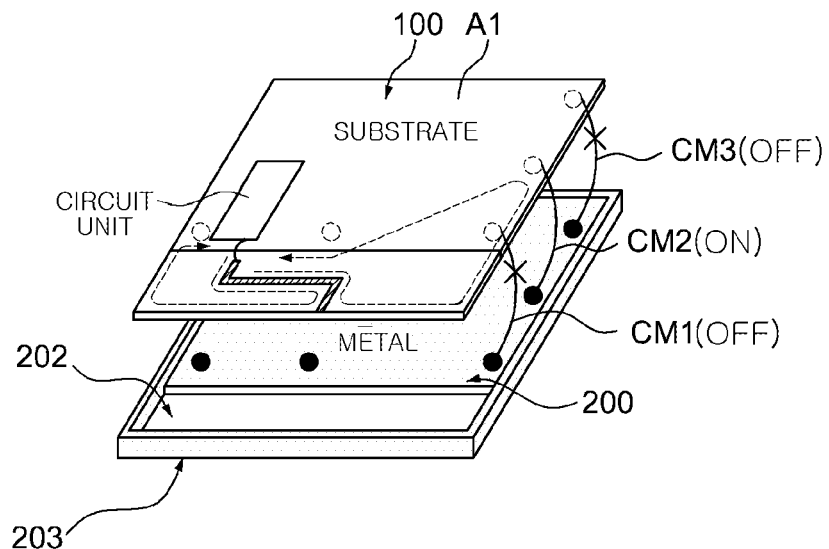
FIGS. 33A and 33B are diagrams illustrating flat and three-dimensional current paths along each of the non-uniform contact conductor lines, according to an embodiment.
Figure 33B:
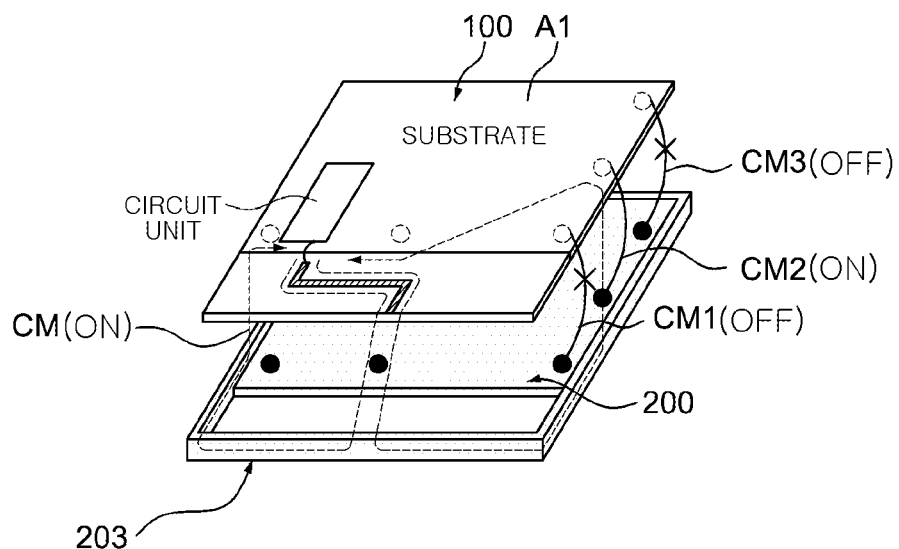

FIGS. 32A and 32B are diagrams illustrating flat and three-dimensional current paths along the dense contact conductor lines, according to an embodiment. FIGS. 33A and 33B are diagrams illustrating flat and three-dimensional current paths along each of the non-uniform contact conductor lines, according to an embodiment.

FIGS. 32A and 32B are diagrams illustrating an example in which the contact conductor lines are densely formed between the metallic region A1 of the substrate 100 and the conductor frame 200.

Referring to FIGS. 32A and 32B, because the contact conductor lines CM of the conductor frame 200 densely connect the metallic region A1 of the substrate 100 to the conductor frame 200, after a current output from the circuit unit passes through the feed line, the conductive connecting member, and the external conductor, the current directly flows into the ground of the circuit unit, through the shortest path in a case in which the first contact conductor line CM1 is selected.

FIGS. 33A and 33B are diagrams illustrating an example in which the contact conductor lines are non-uniformly and sparsely formed between the metallic region A1 of the substrate 100 and the conductor frame 200.

Referring to FIGS. 33A and 33B, because the contact conductor lines of the conductor frame 200 sparsely and non-uniformly connect the metallic region A1 of the substrate 100 to the conductor frame 200, after the current output from the circuit unit passes through the feed line, the conductive connecting member, and the external conductor, the current does not directly flow into the ground of the circuit unit through the closest path because the first contact conductor line CM1 is turned-off. The current flows through the closest second contact conductor line CM2, adjacent to the first contact conductor line CM1. As a result, a person skill in the art will appreciate that a current path different from the current paths illustrated in FIGS. 32A and 32B is formed. The antenna resonance is changed.

FIGS. 34A through 34C are diagrams illustrating resonance frequency characteristics depending on a passage/non-passage of the contact conductor line according to an embodiment.

FIG. 34A is a diagram illustrating a current path in a case in which the first contact conductor line CM1 is selected. Referring to FIG. 34A, in the case in which the first contact conductor line CM1 is selected, the current path is formed by the first contact conductor line CM1.

FIG. 34B is a diagram illustrating a current path in a case in which the first contact conductor line CM1 is not selected and the second contact conductor line is selected. Referring to FIG. 34B, in the case in which the first contact conductor line CM1 is not selected, because the current does not pass through the first contact conductor line CM1, the current flows through the selected second contact conductor line CM2 adjacent to the first contact conductor line CM1.

Referring to FIGS. 34A and 34B, when the current path is changed depending on the contact conductor line being selected, for example, the first contact conductor line CM1 being selected as illustrated in FIG. 34A, in a case in which the electrical length of the current path is relatively short, the resonance is positioned in a relatively high frequency band of the low frequency band. As an example, in the case in which the first contact conductor line CM1 is not selected as illustrated in FIG. 34B, the electrical length of the current path becomes relatively long to have the resonance of a relatively low frequency of the low frequency band.

As described above, the resonance frequency varies by turning the corresponding contact conductor line on and off using the switch. That is, an advantage according to a position change of the contact conductor line is that the current path changes. Thus, the electrical length of the antenna changes and the resonance frequency varies by the change in the electrical length.

Here, according to an embodiment, the locations on the contact conductor lines may be changed depending on a target resonance frequency.

Furthermore, in accordance with an embodiment, other contact conductor lines, except for the contact conductor line changing the resonance length of the antenna, are compactly formed to that the metallic region of the substrate 100 and the conductor frame 200 are advantageously modeled into one conductor and current loss is reduced when the substrate and conductor frame have one ground GND1 and GND2.

On the other hand, an example in which service bands for respective cellular service regions are different from each other will be described. In the past, cellular phones were only able to be used on a network of a communications common carrier, but current cellular phones may be used in service regions of multiple communications common carriers, as well as corresponding networks. Because frequencies assigned to the communications common carriers are different for respective communications common carriers, a roaming service may be used in other service regions, for example, foreign countries.

As such, in order to cover a wide frequency band, the roaming service may be used by using a method with one or more antennas or selecting the frequency using an impedance variable network such as a switch.

As an example, the electronic device according to an embodiment may operate an automatic band scan algorithm upon powering on the cellular phone to scan all scannable bands while changing the impedance matching unit and the contact conductor lines in the cellular phone, thereby scanning the strongest signal band of a base station and setting the strongest signal band as a use band.

According to various embodiments described above, at least one of the first impedance matching unit, the second impedance matching unit, and the third impedance matching unit cover the low frequency band lower than 1 GHz, as well as, the high frequency band higher than 1 GHz by the capacitance coupling, the inductor, or a combination thereof.

According to various embodiments, price competitiveness is secured by increasing a machining yield of the conductor frame, performance of the antenna may be secured, and design competitiveness may be provided.

As set forth above, according to various embodiments, the non-segmented external conductor is used as a main radiator of the antenna by implementing the antenna covering the multiband using the external conductor of a non-segmented portion of the external conductor, in the electronic device having a conductor frame electrically connected to the external conductor to improve, at least, performance of the antenna and easily perform a metal machining to improve a yield.

The apparatuses, units, modules, devices, and other components illustrated in FIGS. 1 through 3.4C are implemented by hardware components. Examples of hardware components include controllers, passive and active elements, sensors, generators, drivers, and any other electronic components known to one of ordinary skill in the art.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A multiband antenna, comprising:
a conductive connecting member disposed on a non-metallic region of an electronic device;
an external conductor disposed on an external surface of the electronic device from a first connecting terminal connected to an end of the conductive connecting member to first and second path terminals, respectively, located opposite to each other; and
a conductor frame connected to the first and second path terminals and a ground of a substrate,
wherein the external conductor comprises
a first external radiation conductor disposed between the first path terminal and the first connecting terminal; and
a second external radiation conductor integrally formed with the first external radiation conductor and disposed between the second path terminal and the first connecting terminal, wherein the first external radiation conductor comprises an electrical length different from an electrical length of the second external radiation conductor.

2. The multiband antenna of claim 1, further comprising:
a first impedance matching unit comprising one end connected to a feed node of a circuit unit mounted on the substrate and another end connected to the conductive connecting member.

3. The multiband antenna of claim 1, wherein the conductive connecting member has an electrical length shorter than an electrical length of the first external radiation conductor or the second external radiation conductor.

4. The multiband antenna of claim 1, wherein the conductive connecting member is connected to the external conductor to be integrally formed with the external conductor.

5. The multiband antenna of claim 2, further comprising:
a second impedance matching unit disposed between the conductive connecting member and the first connecting terminal.

6. The multiband antenna of claim 1, wherein the external conductor is integrally formed with the conductor frame.

7. The multiband antenna of claim 1, wherein the conductor frame comprises:
a first conductor region connected to a first path terminal of the first external radiation conductor and a first ground node of a circuit unit mounted on the substrate; and
a second conductor region connected to a second path terminal of the second external radiation conductor and a second ground node of the circuit unit.

8. The multiband antenna of claim 2, further comprising:
a third impedance matching unit disposed between both ends of the conductive connecting member and the ground of the substrate.

9. An electronic device, comprising:
a substrate comprising a circuit unit;
a first impedance matching unit comprising an end connected to a feed node of the circuit unit;
a conductive connecting member disposed on a non-metallic region of the electronic device and comprising an end connected to another end of the first impedance matching unit;
an external conductor disposed on an external surface of the electronic device from a first connecting terminal connected to another end of the conductive connecting member to first and second path terminals, respectively, located opposite to each other;
a conductor frame connected to the first and second path terminals of the external conductor and a ground of the substrate; and
a display panel configured to display information from the circuit unit,
wherein the external conductor comprises
a first external radiation conductor disposed between the first path terminal of the external conductor and the first connecting terminal to produce a first frequency band, and
a second external radiation conductor integrally formed with the first external radiation conductor and disposed between the second path terminal of the external conductor and the first connecting terminal to produce a second frequency band different from the first frequency band, wherein the first external radiation conductor comprises an electrical length different from an electrical length of the second external radiation conductor.

10. The electronic device of claim 9, wherein the conductive connecting member comprises an electrical length shorter than an electrical length of the first external radiation conductor or the second external radiation conductor.

11. The electronic device of claim 9, wherein the conductive connecting member is connected to the external conductor to be integrally formed with the external conductor.

12. The electronic device of claim 9, further comprising:
a second impedance matching unit disposed between the conductive connecting member and the first connecting terminal.

13. The electronic device of claim 9, wherein the external conductor is integrally formed with the conductor frame.

14. The electronic device of claim 9, further comprising:
contact conductor lines connecting a metallic region of the conductor frame and a metallic region of the substrate to each other.

15. The electronic device of claim 9, further comprising:
a switching device configured to select at least one of the contact conductor lines between the metallic region of the substrate and the conductor frame.

16. A multiband antenna, comprising:
a conductive connecting member disposed on a non-metallic region of an electronic device; and
an external conductor disposed on an external surface of the electronic device, from a first connecting terminal connected to an end of the conductive connecting member to first and second path terminals, respectively, located opposite to each other, the external conductor comprising
a first external radiation conductor defining a first current path between the first path terminal and the first connecting terminal to produce a first frequency band, and
a second external radiation conductor integrally formed with the first external radiation conductor and defining a second current path between the second path terminal and the first connecting terminal to produce a second frequency band, different from the first frequency band, wherein the first external radiation conductor comprises an electrical length different from an electrical length of the second external radiation conductor.

17. The multiband antenna of claim 16, further comprising:
a first impedance matching unit in a feed line between a circuit unit mounted on a substrate and the conductive connecting member.

18. The multiband antenna of claim 17, wherein a current output from the circuit unit of the substrate forms a first current path flowing into a ground of the substrate through the feed line, the first impedance matching unit, the conductive connecting member, and the first external radiation conductor.

19. The multiband antenna of claim 18, wherein the current output from the circuit unit of the substrate forms a second current path flowing into the ground of the substrate through the feed line, the first impedance matching unit, the conductive connecting member, and the second external radiation conductor.

20. The multiband antenna of claim 16, further comprising:
a conductor frame connecting each of the first and second path terminals of the external conductor to respective grounds of the substrate.

21. A multiband antenna, comprising:
a conductive connecting member disposed on a region of an electronic device and connected at one end to a circuit unit mounted on a substrate through a feed line;
a external conductor disposed on an external surface of the electronic device, from a first connecting terminal connected to another end of the conductive connecting member to first and second path terminals, respectively, disposed at opposite locations from each other; and
a conductor frame connecting the first and second path terminals of the external conductor to grounds of the substrate, wherein the external conductor comprises
a first external radiation conductor defining a first current path between the first path terminal and the first connecting terminal to produce a first frequency band, and
a second external radiation conductor integrally formed with the first external radiation conductor and defining a second current path between the second path terminal and the first connecting terminal to produce a second frequency band, different from the first frequency band, wherein an electrical length of the first external radiation conductor is different from an electrical length of the second external radiation conductor to produce the first and second frequency bands between the first and the second radiation conductors, and
wherein the conductive connecting member is disposed on a same layer as the conductor frame in an air space, and a non-metallic region of the conductor frame is disposed between a cover and a display of the electronic device, integrally formed with the external conductor.

22. The multiband antenna of claim 21, further comprising:
a first impedance matching unit in a feed line between the circuit unit mounted on a substrate and the conductive connecting member;
a second impedance matching unit between the conductive connecting member and the external conductor; and
a third impedance matching unit between both ends of the conductive connecting member and one of the grounds of the substrate.

23. The multiband antenna of claim 21, wherein the electrical length of the first external radiation conductor or the second external radiation conductor, respectively, is longer than the electrical length of the conductive connecting member to produce different frequency bands between the first external radiation conductor and the second external radiation conductor.

* * * * *